United States Patent
Schuster et al.

(10) Patent No.: US 10,394,489 B2
(45) Date of Patent: Aug. 27, 2019

(54) REUSABLE MEMORY DEVICES WITH WOM CODES

(71) Applicant: TECHNION RESEARCH & DEVELOPMENT FOUNDATION LTD., Haifa (IL)

(72) Inventors: Assaf Schuster, Haifa (IL); Eitan Yaakobi, Kiryat Shmona (IL); Gala Yadgar, Haifa (IL)

(73) Assignee: TECHNION RESEARCH & DEVELOPMENT FOUNDATION LTD., Haifa (IL)

( * ) Notice: Subject to any disclaimer, the term of this patent is extended or adjusted under 35 U.S.C. 154(b) by 0 days.

(21) Appl. No.: 15/544,957

(22) PCT Filed: Jan. 20, 2016

(86) PCT No.: PCT/IL2016/050063
§ 371 (c)(1),
(2) Date: Jul. 20, 2017

(87) PCT Pub. No.: WO2016/116930
PCT Pub. Date: Jul. 28, 2016

(65) Prior Publication Data
US 2018/0121134 A1    May 3, 2018

Related U.S. Application Data

(60) Provisional application No. 62/106,019, filed on Jan. 21, 2015.

(51) Int. Cl.
*G06F 11/10* (2006.01)
*G06F 3/06* (2006.01)
(Continued)

(52) U.S. Cl.
CPC .......... *G06F 3/0659* (2013.01); *G06F 3/0604* (2013.01); *G06F 3/0652* (2013.01);
(Continued)

(58) Field of Classification Search
CPC .................................. G06F 11/1076
(Continued)

(56) References Cited

U.S. PATENT DOCUMENTS

| 2009/0070657 A1 | 3/2009 | Litsyn et al. |
| 2012/0096328 A1 | 4/2012 | Franceschini et al. |

(Continued)

FOREIGN PATENT DOCUMENTS

WO    2014116301 A1    7/2014

OTHER PUBLICATIONS

Xavier Jimenez et al: "Wear Unleveling: Improving NAND Flash Lifetime by Balancing Page Endurance", 12th USENIX Conference on File and Storage Technologies, FAST 14, pp. 47-59, Feb. 20, 2014.

(Continued)

*Primary Examiner* — Fritz Alphonse
(74) *Attorney, Agent, or Firm* — The Roy Gross Law Firm, LLC; Roy Gross

(57) ABSTRACT

A multiple-write enabled flash memory system, comprising: a flash memory comprising at least two planes, wherein each plane comprises multiple blocks, and wherein each block comprises multiple pages; an FTL memory manager configured: to reference one or more clean active blocks on each plane for a first write, wherein the first-write comprises writing one logical page of unmodified data to one physical page, and to reference one or more recycled active block on each plane for a second write, wherein each page of each recycled active block stores data from a previous first-write; and an encoder configured to encode a page of data via a (Continued)

write-once-memory (WOM) code to produce WOM-encoded data, wherein a combination of a target page of each recycled active block is configured to store the WOM-encoded data via a second write.

8 Claims, 15 Drawing Sheets

(51) Int. Cl.
    *G06F 12/02*     (2006.01)
    *G11C 29/52*     (2006.01)
    *G11C 7/10*     (2006.01)
    *G11C 16/10*     (2006.01)
    *G11C 16/34*     (2006.01)

(52) U.S. Cl.
    CPC .......... *G06F 3/0661* (2013.01); *G06F 3/0679* (2013.01); *G06F 11/1048* (2013.01); *G06F 11/1068* (2013.01); *G06F 12/0246* (2013.01); *G11C 7/1006* (2013.01); *G11C 16/10* (2013.01); *G11C 16/3495* (2013.01); *G11C 29/52* (2013.01); *G06F 2212/7201* (2013.01); *G06F 2212/7205* (2013.01); *G06F 2212/7207* (2013.01); *G06F 2212/7208* (2013.01); *G06F 2212/7209* (2013.01)

(58) Field of Classification Search
    USPC ........................................ 714/764, 766, 768
    See application file for complete search history.

(56) References Cited

U.S. PATENT DOCUMENTS

| 2014/0244912 A1 | 8/2014 | Birk et al. | |
| 2015/0106557 A1* | 4/2015 | Yu ..................... | G11C 16/3431 711/103 |
| 2016/0162353 A1* | 6/2016 | Manohar ............. | G06F 11/1048 714/760 |
| 2017/0116076 A1* | 4/2017 | Sharma ................. | G11C 29/02 |

OTHER PUBLICATIONS

Yu Lie: "Algorithms and data representations for emerging non-volatile memories", Doctoral dissertation, Texas A&M University, May 31, 2014.

Ronald L Rivest: "How to Reuse a Write-Once Memory", Information and Control, vol. 55, Nos. 1-3, pp. 1-19, Dec. 1982.

David Burshtein: "Polar Write Once Memory Codes", IEEE Transactions on Information Theory, vol. 59, No. 8, pp. 5088-5101, Aug. 2013.

International Search Report for PCT/IL2016/050063 Completed May 3, 2016; dated May 9, 2016 5 Pages.

Written Opinion of ISR for PCT/IL2016/050063 Completed May 3, 2016; dated May 9, 2016 5 Pages.

* cited by examiner

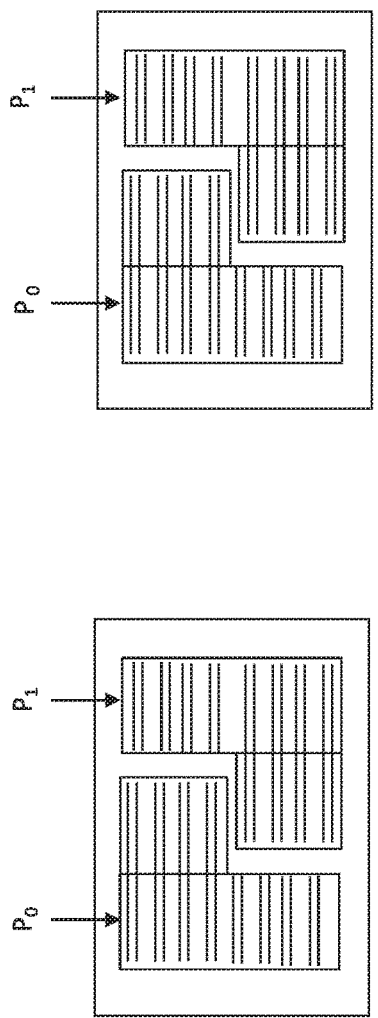
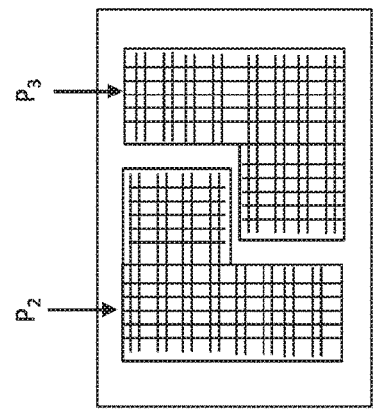
FIG. 1A
FIG. 1B
FIG. 1C

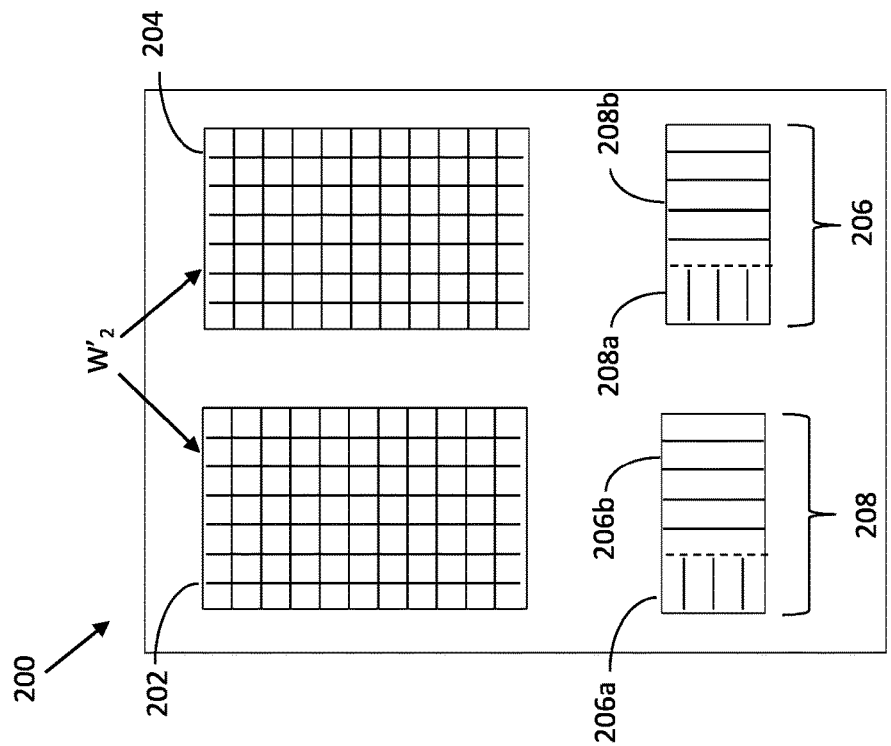
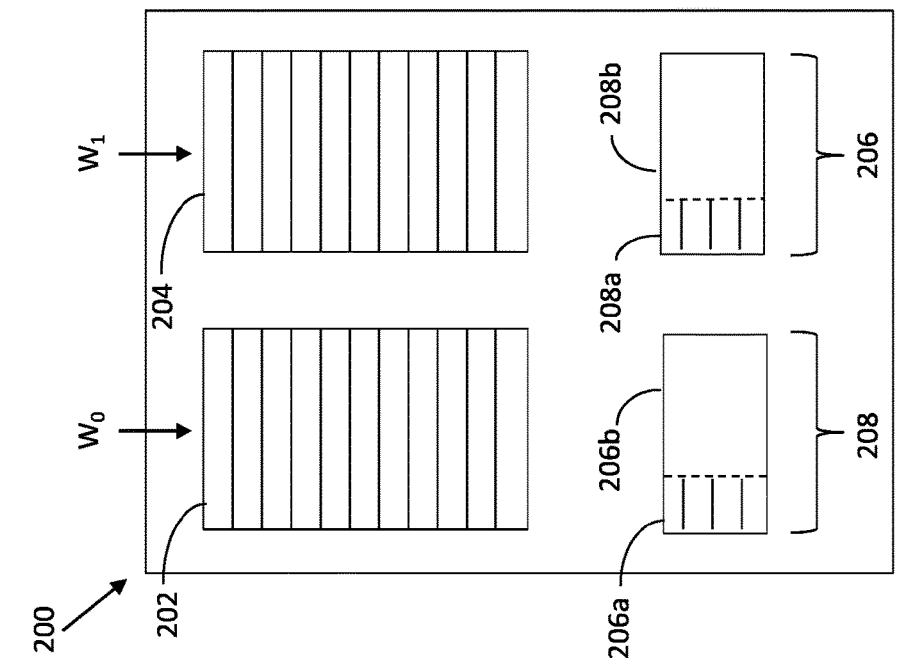

REUSABLE MEMORY DEVICES WITH WOM CODES

FIELD OF THE INVENTION

The invention relates to the field of memory devices.

BACKGROUND

Flash-based memory devices such as solid state drives (SSD) are increasingly popular due to their short read and write latencies, and increased throughput. Flash memory is typically built from programmable floating-gate cells, organized as blocks, which are the units of erasure. Each block typically contains 64-384 pages, ranging in size from 2 KB to 16 KB, which are the read and write units. Thus, before rewriting a given page, its entire block, including all the other pages included in that block, must be erased.

Since a block must be erased before a page can be rewritten, flash memory must be 'overprovisioned' to allow out-of-place rewrites. In this case, the previous location is marked as invalid, the data is rewritten on a clean page and a Flash Translation Layer (FTL) maps logical to physical addresses. Overprovisioning is defined as $$\frac{T-U}{U},$$

where T and U represent physical and logical blocks, respectively. Typical values for overprovisioning are between 7% and 28%.

However, SSDs have several drawbacks, namely that they must be erased before being rewritten. A zero can be written as a one, but a one cannot revert back to a zero until the entire block is erased. Before a given block can be erased for reuse, any valid pages must be rewritten, incurring additional overhead that affects performance. Additionally, the lifetime of flash memory cells is limited by the number of erasures a block can endure before its reliability deteriorates below an acceptable level.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a multiple-write enabled flash memory system, comprising: a flash memory comprising at least two planes, wherein each plane comprises multiple blocks, and wherein each block comprises multiple pages; a block allocator configured: (a) to reference one or more clean active blocks on each plane for a first write, wherein the first-write comprises writing one logical page of unmodified data to one physical page, and (b) to reference one or more recycled active block on each plane for a second write, wherein each page of each recycled active block stores data from a previous first-write; and an encoder configured to encode a page of data via a write-once-memory (WOM) code to produce WOM-encoded data, wherein a combination of a target page of each recycled active block is configured to store the WOM-encoded data via a second write.

There is further provided, in accordance with an embodiment, a first portion of a spare page area provided with each target page is configured to store the WOM-encoded data via the second write.

There is further provided, in accordance with an embodiment, a second portion of each spare page area is configured to store a first error correction code associated with the first write.

In some embodiments, the first portion of each spare page area is configured to store an error correction code associated with the second write.

In some embodiments, referencing the clean active block on each plane comprises selecting a block on each plane that has never been written to, or has been erased and has not been written to since the erasure.

In some embodiments, each plane is configured to enable writing in parallel to each target page of each recycled active block of each plane.

In some embodiments, each target page has the same offset address within each block.

In some embodiments, the target page is retrieved prior to receiving a request to perform the second write.

There is further provided, in accordance with an embodiment, a garbage collector that is configured to designate a block for cleaning, erasing, or recycling, in accordance with a recycling policy.

In some embodiments, the garbage collector is configured to generate a clean or recycled block from the designated block.

In some embodiments, the recycling policy comprises erasing a victim block with a predefined valid page count.

In some embodiments, erasing comprises copying a valid page from the victim block to one of the clean active blocks.

In some embodiments, copying the valid page comprises decoding via a WOM decoder the valid page and a second valid page that is associated with the valid page in a second-write to produce a decoded valid page, and writing the decoded valid page to another active block.

In some embodiments, the garbage collector is invoked if the number of available clean and recycled blocks falls beneath a predefined threshold.

There is further provided, in accordance with an embodiment, a write resolver that is configured to determine whether to write data as a first-write or as a second write.

In some embodiments, the resolver is configured to direct a request to write cold data as a first write, and to direct a request to write hot data as a second write.

In some embodiments, the resolver is configured to direct a request to write data as a higher-error-rate enabled first-write after a predetermined bit-error-rate threshold has been reached.

In some embodiments, writing the data as a higher-error-rate enabled first-write comprises utilizing the first and second portions of the spare page area to store a second error correction code corresponding to the higher-error-rate enabled first write.

There is further provided, in accordance with an embodiment, a load balancer that is configured to select one of the multiple clean active blocks for a first write, in accordance with a load balancing policy.

In some embodiments, the complexity of the WOM code has a similar order of magnitude as the complexity of computing the first error correction code.

In some embodiments, the second-write comprises a first encoding via the WOM code and a second encoding via the WOM code upon determining that the first encoding failed.

In some embodiments, writing the logical page of unmodified data in the first-write comprises writing the complement of the of unmodified data if the data includes more ones than zeros.

In some embodiments, the WOM code requires approximately 210% physical pages to store a logical page, and wherein the WOM code has a success rate of approximately 95%.

In some embodiments, the spare page area comprises approximately 9% of the target page, and wherein approximately 28% of the spare page area is allocated for storing the first error correction code, and wherein approximately 72% of the spare page area is allocated for approximately 5% of the WOM code as well as an error correction code corresponding to the WOM code.

There is provided, in accordance with an embodiment, a method for enabling second writes for a flash memory system, comprising: referencing one or more clean active blocks on each of at least two planes of a flash memory for a first-write, wherein the first-write comprises writing one logical page of unmodified data to one physical page; referencing one or more recycled active block on each plane for a second write, wherein each page of each recycled active block stores data from a previous first-write; and encoding a page of data via a WOM code to produce WOM-encoded data, wherein a combination of a target page of each recycled active block is configured to store the WOM-encoded data via a second write.

In some embodiments, a first portion of a spare page area provided with each target page is configured to store the WOM-encoded data via the second write.

In some embodiments, the method further comprises configuring a second portion of each spare page area for storing a first error correction code associated with the first write.

In some embodiments, the method further comprises configuring the first portion of each spare page area for storing an error correction code associated with the second write.

In some embodiments, referencing the clean active block on each plane comprises selecting a block on each plane that has never been written to, or has been erased and has not been written to since the erasure.

In some embodiments, the method further comprises configuring each plane to enable writing in parallel to each target page of each second block of each plane.

In some embodiments, each target page has the same offset address within each block.

In some embodiments, the method further comprises retrieving the target page prior to receiving a request to perform the second write.

In some embodiments, the method further comprises designating a block for cleaning, erasing, or recycling, in accordance with a recycling policy.

In some embodiments, the method further comprises generating a clean or recycled block from the designated block.

In some embodiments, recycling policy comprises erasing a victim block with a predefined valid page count.

In some embodiments, erasing the recycled active block comprises copying a valid page from the second block to one of the clean active blocks.

In some embodiments, copying the valid page comprises decoding, via a WOM decoder, the valid page and a second valid page that is associated with the valid page in a second-write to produce a decoded valid page, and writing the decoded valid page to one of the clean active blocks.

In some embodiments, the method further comprises invoking a garbage collector if the number of available clean and recycled blocks falls beneath a predefined threshold.

In some embodiments, the method further comprises determining whether to write a write request via a first-write or via a second write.

In some embodiments, determining comprising directing a request to write cold data as a first write, and directing a request to write hot data as a second write.

In some embodiments, the method further comprises directing a request to write data as a higher-error-rate enabled first-write after a predetermined bit-error-rate threshold has been reached.

In some embodiments, writing the data as a higher-error-rate enabled first-write comprises utilizing the first and second portions of the spare page area to store a second error correction code corresponding to the higher-error-rate enabled first write.

In some embodiments, the method further comprises selecting one of the multiple clean active blocks for a first write, in accordance with a load balancing policy.

In some embodiments, the complexity of the WOM code has a similar order of magnitude as the complexity of computing the first error correction code.

In some embodiments, the second-write comprises a first encoding via the WOM code and a second encoding via the WOM code upon determining that the first encoding failed.

In some embodiments, writing the logical page of unmodified data in the first-write comprises writing the complement of the unmodified data if the data includes more ones than zeros.

In some embodiments, the WOM code requires approximately 210% physical pages to store a logical page, and wherein the WOM code has a success rate of approximately 95%.

In some embodiments, the spare page area comprises approximately 9% of the target page, and wherein approximately 28% of the spare page area is allocated for storing the first error correction code, and wherein approximately 72% of the spare page area is allocated for approximately 5% of the WOM code as well as an error correction code corresponding to the WOM code.

There is provided, in accordance with an embodiment, a method for writing data to a flash memory, comprising: encoding a logical page of data using a WOM code; and writing in parallel, via a second-write, the WOM-encoded data to at least a first physical page, and a second physical page, wherein the first physical page is located on a different plane than the second physical page and, and wherein both the first and second physical pages have been written to in a first-write.

In some embodiments, the method further comprises writing the WOM-encoded data to a first portion of a spare page area provided with each of the first and second physical pages.

In some embodiments, the method further comprises storing a first error correction code associated with the first-write at a second portion of each spare page area.

In some embodiments, the method further comprises storing an error correction code associated with the second write at the first portion of each spare page area.

In some embodiments, the first-write comprises writing to a page on a block that has never been written to, or has been erased and has not been written to since the erasure.

In some embodiments, the first and second physical pages have the same offset address.

In some embodiments, the method further comprises retrieving the data from the first and second pages prior to receiving a request to write the second-write.

In some embodiments, the method further comprises designating a block for cleaning, erasing, or recycling, in accordance with a recycling policy.

In some embodiments, the method further comprises generating a clean or recycled block from the designated block.

In some embodiments, the recycling policy comprises erasing a victim block with a predefined valid page count.

In some embodiments, erasing the recycled active block comprises copying a valid page from the second block to one of the clean active blocks.

In some embodiments, copying the valid page comprises decoding, via a WOM decoder, the valid page and a second valid page that is associated with the valid page in a second-write to produce a decoded valid page, and writing the decoded valid page to one of the clean active blocks.

In some embodiments, the method further comprises invoking a garbage collector if the number of available clean and recycled blocks falls beneath a predefined threshold.

In some embodiments, the method further comprises determining whether to write a write request via a first-write or via a second write.

In some embodiments, determining comprising directing a request to write cold data as a first write, and directing a request to write hot data as a second write.

In some embodiments, the method further comprises directing a request to write data as a higher-error-rate enabled first-write after a predetermined bit-error-rate threshold has been reached.

In some embodiments, writing the data as a higher-error-rate enabled first-write comprises utilizing the first and second portions of the spare page area to store a second error correction code corresponding to the higher-error-rate enabled first write.

In some embodiments, the method further comprises selecting one of the multiple clean active blocks for a first write, in accordance with a load balancing policy.

In some embodiments, the complexity of the WOM code has a similar order of magnitude as the complexity of computing the first error correction code.

In some embodiments, the second-write comprises a first encoding via the WOM code and a second encoding via the WOM code upon determining that the first encoding failed.

In some embodiments, writing the first-write comprises writing the complement if writing the first-writ comprises writing more ones than zeros.

In some embodiments, the WOM code requires approximately 210% physical pages to store a logical page, and wherein the WOM code has a success rate of approximately 95%.

In some embodiments, the spare page area comprises approximately 9% of the target page, and wherein approximately 28% of the spare page area is allocated for storing the first error correction code, and wherein approximately 72% of the spare page area is allocated for approximately 5% of the WOM code as well as an error correction code corresponding to the WOM code.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

FIGS. 1A-C illustrate a graphical depiction of multiple writes at the same memory location in accordance with an embodiment;

FIGS. 2A-B illustrates an exemplary system for allocating memory, in accordance with an embodiment;

DETAILED DESCRIPTION

Figure 2C:
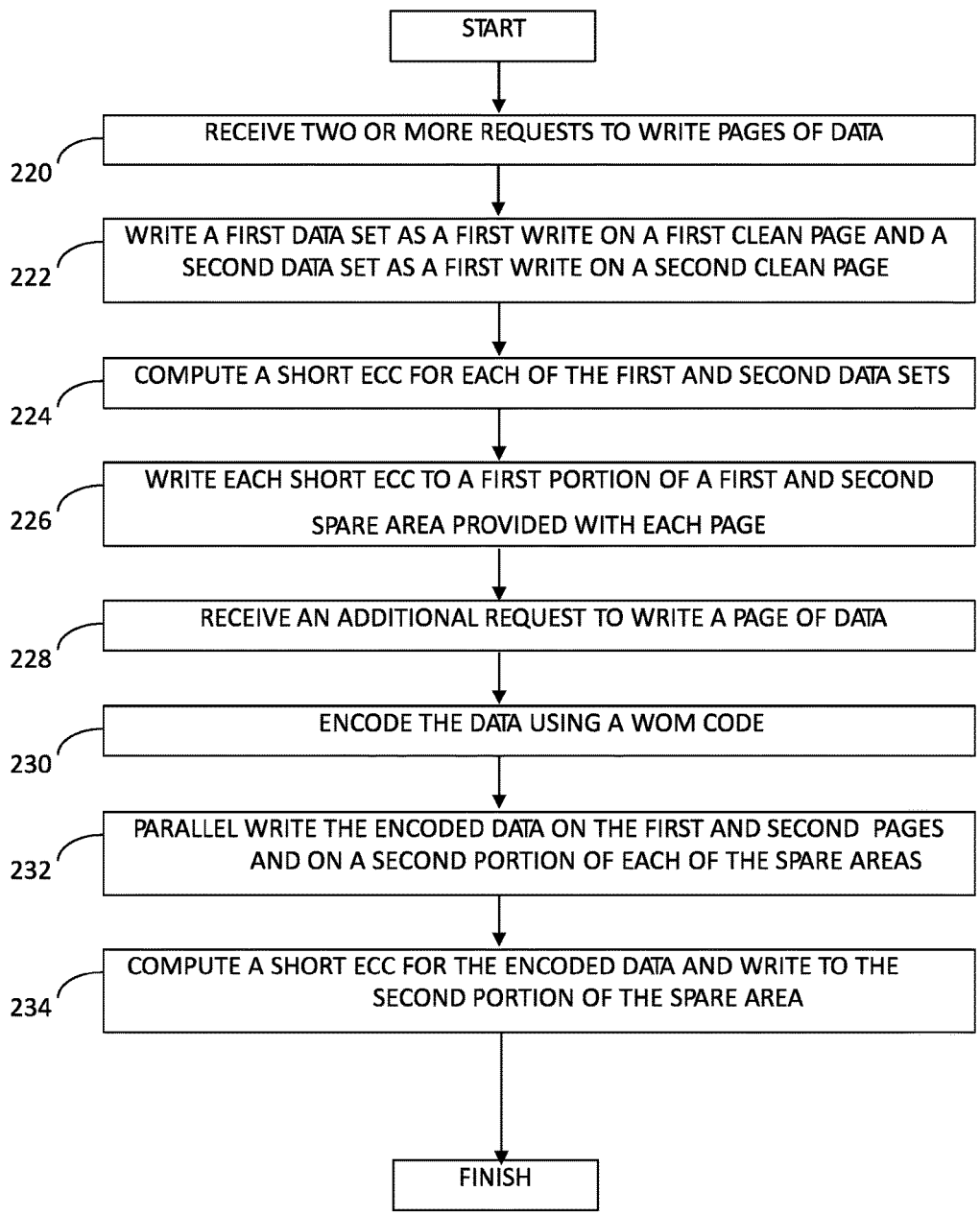
FIG. 2C is a flowchart of a method for performing second-writes, in accordance with the system of FIG. 2B.

A system and method are disclosed herein to apply WOM (Write-Once Memory) codes to enable performing second writes on a flash memory medium, to reduce overall erasures and extend the lifetime of a memory device which comprises the medium.

WOM codes were first introduced by Rivest and Shamir: *How to Reuse a Write-Once Memory, Inform. And Contr.,* 55(1-3):1-19, December 1982, and transform data in a manner to ensure that consecutive writes only require that zeros be over-written with ones, and not vice versa. A sample WOM code is illustrated in Table 1, as follows:

TABLE 1

| be | $1^{st}$ Write | $2^{nd}$ Write |
|----|----------------|----------------|
| 00 | 000            | 111            |
| 10 | 100            | 011            |
| 01 | 010            | 101            |
| 11 | 001            | 110            |

This code enables second writes for a write-once medium by transforming two bits of information to a three-bit code, allowing a total of four bits to be written onto three cells. Although a general write-once medium would require four cells to encode the same information, this code still demands 50% more physical bits over the equivalent logical size.

FIGS. 1A-C together illustrate a graphical depiction of multiple writes over the same memory location, in accordance with an embodiment. FIG. 1A shows a first-write as horizontal lines, where writing two logical pages $P_0$ and $P_1$ requires 3 physical pages of memory. FIG. 1B illustrates invalidating $P_0$ and $P_1$ before rewriting $P_2$ and $P_3$, shown in FIG. 1C as vertical lines, over the same physical memory cells as $P_0$ and $P_1$. According to the scheme of Table 1 and FIGS. 1A-C, every page of data must be encoded and written into 1.5 physical pages of memory in order to allow invalidation and a second-write at the same physical address. A memory device configured under such a construction may utilize ⅔ of its available storage capacity, and every input/output (I/O) operation would need to access 50% more physical memory over the logical size, increasing I/O latency.

Since flash memory erasure are a major contributor to cell wear, applying WOM codes may be used to reduce cell erasure by allowing cells to be reused for multiple writes. However there are several drawbacks: the cell values of the target location must be read before new data can be correctly encoded, and additionally, WOM codes inflate the data, requiring at least 29% more physical space to store the original logical data.

Thus, the WOM codes to enable second writes may be selected to meet the following constraints:

first writes may be performed with unmodified data, and may comprise writing one logical page of unmodified data to one physical page.

The complexity of encoding via the WOM code is comparable, and may have a similar order of magnitude as the complexity for calculating typical error correction codes (ECC).

By avoiding any encoding computation and memory requirements for first writes, no additional I/O latency or memory requirements are incurred. Furthermore, by matching the complexity of the ECC code with the WOM code, any encoding and decoding can be performed in parallel, or even combined, without incurring any additional delays.

In one embodiment, polar WOM codes as are known in the art to have a computational complexity similar to ECC codes, as disclosed in D. Burshtein and A. Strugatski, *'Polar write once memory codes. IEEE Transactions on Information Theory,* 59(8):5088-5101, 2013, may be applied. Table 2 below summarizes several candidate WOM codes for a 4 KB page size, where storage requirement refers to the physical storage requirements relative to the logical page size:

TABLE 2

| | code | | | | | |
|---|---|---|---|---|---|---|
| | a | b | c | d | e | f |
| Storage Requirement | 200% | 206% | 208% | 210% | 212% | 214% |
| Success Rate | 0 | 5% | 58% | 95% | 99% | 100% |

As can clearly be seen from Table 2 above, there is a tradeoff between storage requirements and success rate, where a 100% success rate requires three physical pages to store a single logical page, and which precludes concurrent writing all three pages concurrently, adding latency. By contrast, a code requiring exactly two physical pages for a second-write is guaranteed to fail in practice.

Each page may be augmented with a 'page spare area' that is primarily used for storing redundancy bytes of any error correction codes that were applied to the written data. In an embodiment, this spare area may range from 5% to 12.5% of the logical size of the page.

In an embodiment, a portion of the page spare area reserved for error correction encoded (ECC) bits for a given block may be utilized to implement an inflated second-write on that same block. Since the bit error rate increases with block lifetime, a weaker ECC code requiring fewer bits may be used for a number of writes, such as until the bit error rate (BER) for those blocks reaches a predefined threshold. This leaves the remaining bits of the page spare area that are not used for storing the shorter ECC code available for an inflated second write.

Thus, while the BER for a block is below the threshold, the spare area may be divided into multiple portions: a first portion configured for storing the shorter, weaker ECC code for the data written to the block as a first write, a second portion may be configured for storing a portion of the inflated second write, and a third portion may be configured to store the ECC code for the second write.

Once the block's BER exceeds the threshold, the block may revert to be used for first writes only, and the page spare area may be reserved for storing a longer encoded sequence resulting from a stronger ECC code. In an embodiment, a block may be limited to perform second writes during the first 30% of the lifetime of the disk. Imposing this limit may compensate degraded reliability as the chip gets older, and allow for a stronger ECC code utilizing the entire spare page area when necessary.

Reference is now made to FIGS. 2A-B which illustrates an exemplary system for allocating memory, in accordance with an embodiment. Referring to FIG. 2A, a block 200 may include pages, 202 and 204 that are each configured for and are written to using first-write operations $W_0$ and $W_1$, respectively, and shown as horizontal lines across blocks 202, and 204. $W_0$ and $W_1$ may each have a logical size comparable to the physical size of pages 202 and 204, and may be written directly as a first-write to pages 202 and 204 with no additional overhead.

The pages of block 200 may each be provided with page spare areas 206 and 208, such as may be typically provisioned for storing a sequence of redundancy bits corresponding to a stronger ECC code, $ECC_1$ for $W_0$ and $W_1$, where the length of $ECC_1(W_0)$ and $ECC_1(W_1)$ is substantially the same length as page spare areas 206 and 208. However, since the reliability of block 200 is typically higher when the block is relatively new, such as during the first 30% of the block's lifetime, a weaker ECC code, $ECC_2$ requiring fewer encoded bits, may suffice to correct any errors for the first predefined number of writes. Thus, shorter redundancy ECC codes, $ECC_2(W_0)$ and $ECC_2(W_1)$, may be calculated for first writes $W_0$ and $W_1$ and written to sub-areas 206a and 208a of page spare areas 206 and 208, shown as horizontal lines in FIG. 2A, leaving sub-areas 206b and 206b available.

Reference is made to FIG. 2B which illustrates a system for enabling second writes in accordance with an embodiment. A block 200 may enable a second-write $W_2'$ that is comparable in logical size to either $W_0$ or $W_1$. $W_2'$ may be encoded, using conventional techniques, via any of the WOM constructions described herein as WOM($W_2'$) and which may require at least two physical memory pages, as outlined in Table 2 above. WOM($W_2'$) may be written as a second-write to a combination of pages 202 and 204 and additionally on portions 206b and 208b, illustrated as vertical lines, where the physical storage space encompassed by the combination of pages 202 and 204 and portions 206b and 208b may be configured for storing WOM($W_2'$). Portions 206b and 208b may be additionally configured to store a shortened ECC that may be computed for $W_2'$ as $ECC_2(W_2)$ and written to portions 206b and 208b. Thus, the spare page area may be used to store the ECC of the first write, and/or the WOM-encoded second write with the ECC of the second-write, In an embodiment, the spare page areas 206 and 208 may divided into more than two portions, each configured to store an ECC code for the first-write, a portion of the WOM-encoded second-write, and an ECC code for the WOM-encoded second-write.

Reference is now made to FIG. 2C which is a flowchart of a method for performing second-writes, in accordance with the system of FIG. 2B. Two or more requests may be received to write pages of data (Step 220). A first data set may be written as first-write to a first clean page, and a second data set may be written as a first write on a second clean page, where the first and second clean pages may be located on two separate planes of a disk (Step 222). A short ECC code may be computed for each of the two pages (Step 224), and the ECC codes may each be written to a first portion of a spare page memory provided with each page (Step 226). An additional request may be received to write a page of data (Step 228). The data may be encoded via a WOM code and may, in some embodiments, require storage space equivalent to at least two physical pages (Step 230). The WOM encoded data may be written in parallel to both of the the first and second pages that were written to in the first-write, and additionally, in an embodiment, to a second portion of the spare page areas provided with each page (Step 232). A short ECC code may be computed for the inflated WOM encoded data, and the computed code may be written to the second portion of the spare page areas (Step 234). In an embodiment, the short ECC code for the inflated WOM encoded data may be written to a third portion of the spar page areas.

In one exemplary implementation, WOM code d from Table 2 may be applied for second writes. This WOM code has a success rate of 95% and requires 210% additional physical storage space over the logical size. Each page of block 200 is augmented by a spare page area equivalent to 9% of the page size, and which is allocated as follows: 2.5%, equivalent to approximately 28% of the page spare area and corresponding to areas 206a and 208a, is allocated for the weaker ECC encoding of the first write; the remaining 6.5%, equivalent to approximately 72% of the page spare area and corresponding to areas 206b and 208b, may each be allocated to store 5% of the WOM encoded output, as well as the weaker ECC encoding for the second write and which may require 4% of the page size. In this manner, $W_2'$, which may be equivalent to one logical page but may be inflated by 210% via encoding by the WOM construction for a second write, may be written over two pages, 202 and 204, as well as spare page area portions 206b and 208b, each equivalent to 5% of a page, yielding the required 210% physical page space. Since 2.5% of the page size is sufficient for encoding an ECC for the first 30% of the block's lifetime, second writes may be disabled for the following 70% lifetime of the block.

The 95% success rate of the WOM code selected above may result in a nonnegligible failure rate. If the WOM encoding fails, such as if the encoding results in writing a zero to a cell that has already been programmed with a one, the encoding may be retried. The probability of a second failure is 0.05*0.05, or 0.25%. In the case of two consecutive failures for WOM encoding, the data is written as a first write.

The aforementioned ratios and quantities are for exemplary purposes only, and other quantities and ratios may be applied to achieve various trade-offs between storage capacity and reliability, using a variety of WOM codes, page sizes, and spare page area size.

Thus, in one embodiment, by using a weaker ECC code for first writes when the BER is low, inflated second writes may be enabled by utilizing a portion of spare page area that is normally allocated for stronger ECC codes. For subsequent writes when the BER rises above a predefined threshold, second writes may be disabled, and the entire spare page area may be allocated for a stronger ECC code.

In one embodiment, implementing a second-write may require that at least 50% of the cells on a page are set to zero. To ensure this condition, if the first-write requires that more than 50% of the cells on the page are programmed to one, the logical complement of the data is written on the page instead of the original data, and a bit may be set to flag this modification.

To estimate an expected reduction in the number of erasures performed by performing second-writes, the minimal number of erasures E for a standard disk allowing only first writes is given as $$E = \frac{M}{N},$$

where M are the number of page write requests, and N are the number of pages on a block. Allowing second-writes raises the number of pages that can be written each block $$N + \frac{N}{2}$$

before the block needs to be erased. Thus the minimal number of erasures for second-write enabled memory devices is given as $$E' = \frac{M}{N + N/2}$$

and which equals to ⅔E or a reduction of 33% over a disk without second-write capability.

To calculate the effect on the memory device's lifetime, a standard memory device may accommodate W page writes. 30% of these writes, or 0.3W are written in the first 30% of the memory device's lifetime. With second writes, 50% more pages can be written, or another 0.5*0.3W=0.15W, resulting in a total of 1.15W, and which is equivalent to an increase of 15% in the memory device's lifetime.

Figure 3A:
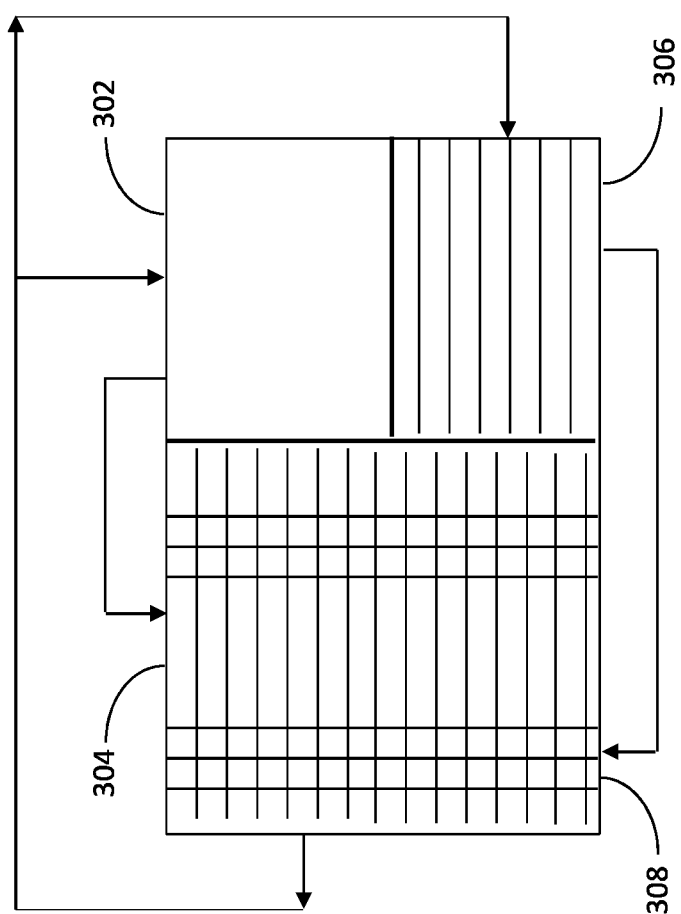
FIGS. 3A-B illustrates another exemplary system for allocating memory, in accordance with an embodiment.

Reference is made to FIG. 3A which illustrates another exemplary system for allocating memory, in accordance with an embodiment. The memory blocks of the device may transition between one of four logical states that provide a different functionality, and are shown as partitions for illustrative purposes only: a block may be classified as clean 302 if it has either never been written to, or has been erased and not written to since, and is available for first writes; once all the pages within the block have undergone a first write, the block may be classified as used 304, marked by horizontal lines for illustrative purposes only; a block in the used state may be selected by a garbage disposal application for recycling, and may be designated as recycled 306 availing any invalid pages in the block for second writes; once all the invalid pages of a recycled block have undergone a second write, the block may be classified as reused 308, marked for illustrative purposes with both vertical and horizontal lines. The garbage disposal application may designate a reused block for cleaning, and after being erased, the block may be classified as clean 302 once again.

In one embodiment, a used block may be erased without transitioning to the recycled and used states, and move directly to the clean state.

Figure 4A:
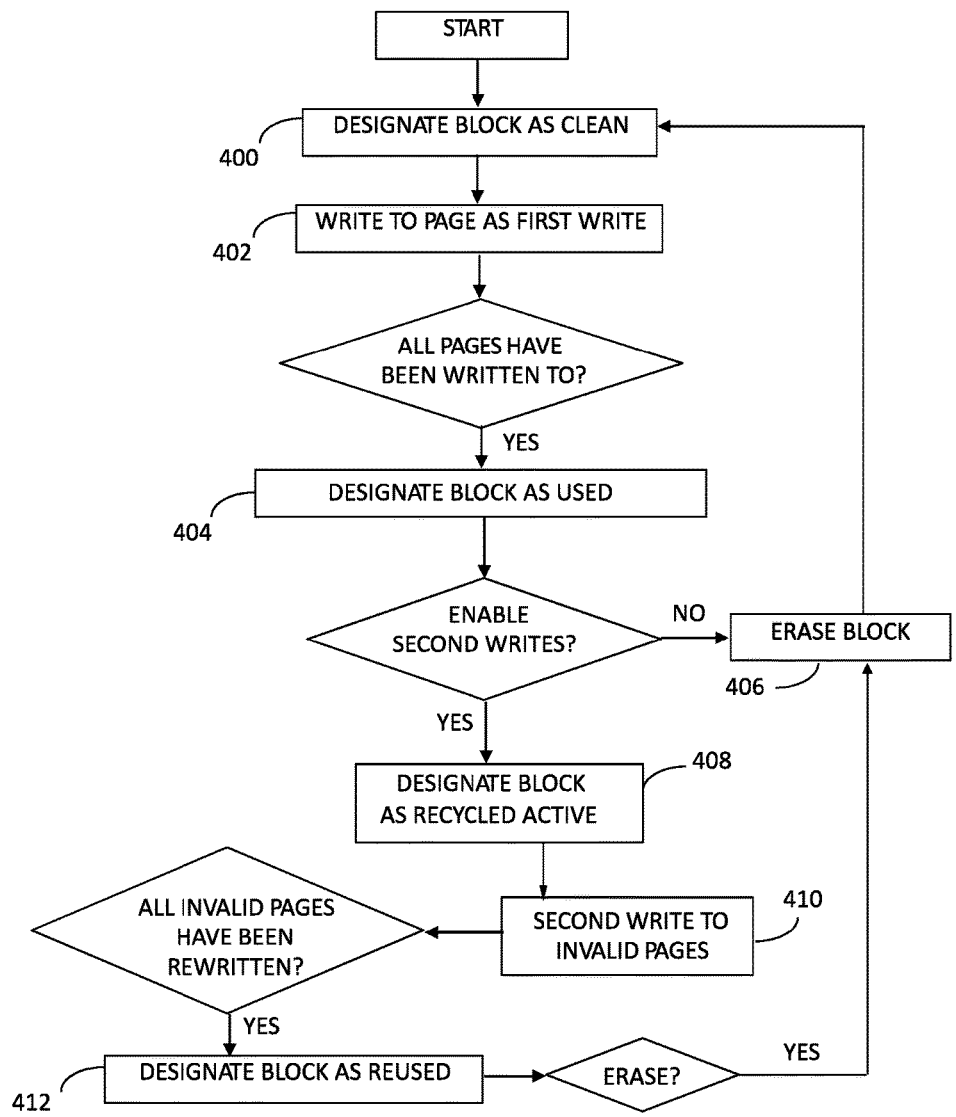
FIG. 4A illustrates a flowchart of a use cycle for a memory block, in accordance with the system of FIG. 3A.

Reference is now made to FIG. 4A which illustrates a flowchart of a method for a memory recycling policy, in accordance with FIG. 3A. A block may initially be classified as clean (Step 400). Data may be written to the clean block a first-write (Step 402). Once all the pages of the clean block have been written to, the block may be designated as used (Step 404). If the block is not enabled for second writes, the block may be erased (Step 406), and returned to the clean state (Step 400). If the block is enabled for second writes, the blocks may be classified by the garbage collection policy as recycled active (Step 408).

Figure 3B:
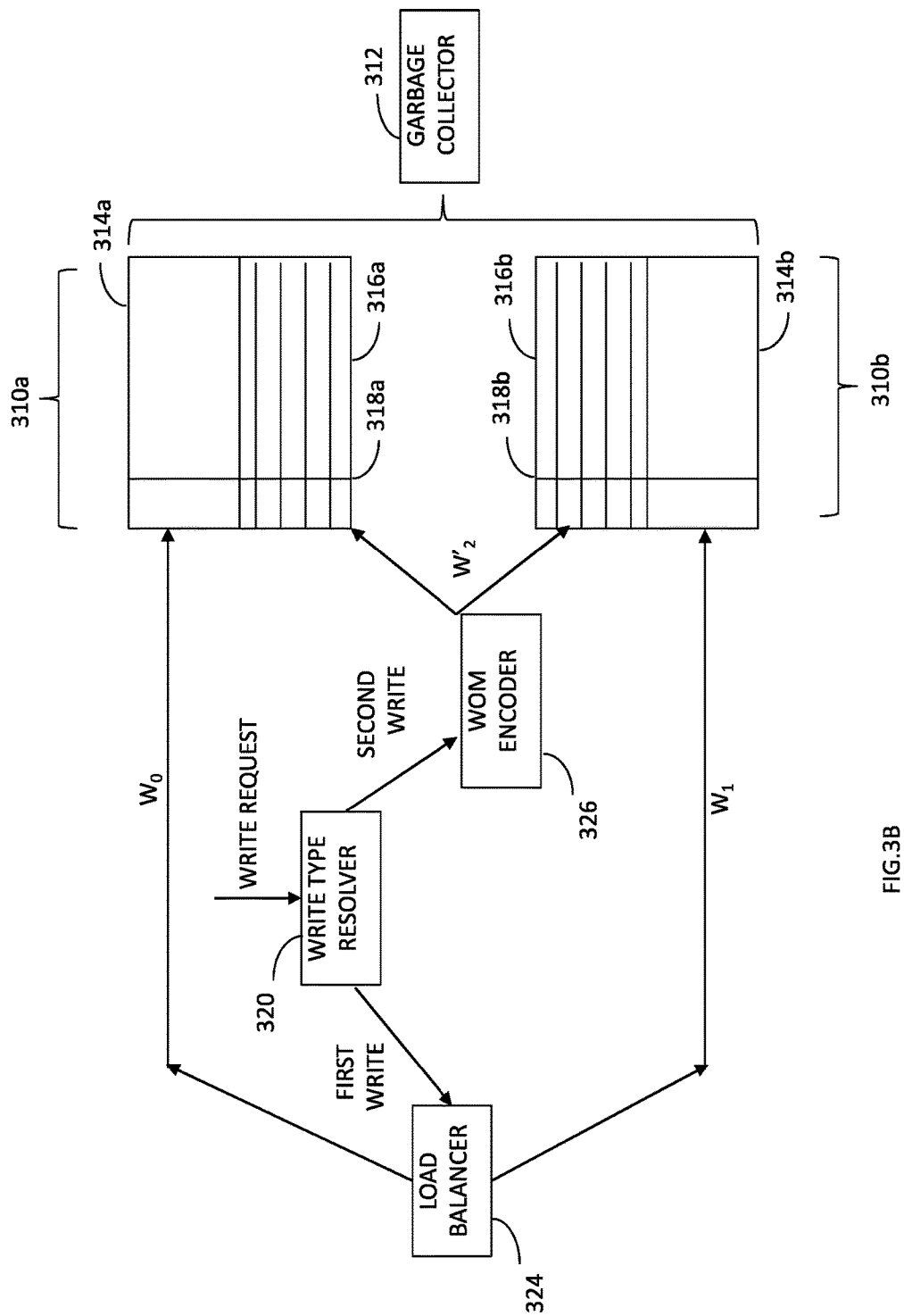

One or more second writes may be performed on one or more invalid pages of the recycled block (Step 410). If all the invalid pages have been written to in a second write, the recycled block may be classified as reused (Step 412). If the garbage collection policy determines to erase the reused block, the reused block may be erased (Step 406), and returned to the clean state (Step 400). Reference is now made to FIG. 3B which illustrates a block flow diagram of another memory management scheme in accordance with an embodiment. The blocks and arrows of FIG. 3B are to be understood as conceptual only, and are meant to illustrate the logical flow of an embodiment of the invention.

As disclosed above, blocks may be divided among two or more planes 310a and 310b of the chip that can each be accessed separately for read and write operations. This property may be leveraged to reduce latency by writing in parallel to two blocks.

A garbage collector 312 may be provided to designate, in accordance with a recycling policy which will be described in greater detail below, one or more blocks of planes 310a and 310b for cleaning, erasing, or recycling, as described above in FIG. 3A.

A block allocator (not shown) may reference a pool comprising one or more clean active blocks on each plane have never been written to, or have been erased and have not been written to since the erasure, and that are available for a first-write. Referring to FIG. 3B these blocks are labeled as 314a on plane 310a and block 314b on plane 310b and shown as blank to represent their clean state and readiness for a first write.

Additionally, the block allocator may reference a pool comprising one or more recycled active blocks, where each page of each recycled block may store data from a previous first write. Planes 310a and 310b may be configured to enable writing in parallel to the pages of each recycled active block on each respective plane.

The following simplified example describes an implementation of a memory management scheme using a single clean active and a single recycled active block per plane. However, this is for exemplary purposes only, and it is to be understood that a given moment, each plane may have multiple clean and recycled active blocks that may be referenced by the block allocator and that are available for first and second writes, accordingly.

A first target page from block 316a and a second target page from block 316b may, together with a portion of each page's respective spare page area, be configured to store at least two pages of a WOM-encoded second write. Referring to FIG. 3B these blocks are labeled as 316a on plane 310a and block 316b on plane 310b and shown with horizontal lines to represent their recycled state and readiness for a second inflated write. Each of blocks 314a and 314b may be provided with spare page areas as described above, and which are delineated by dividing lines 318a and 318b, and which may be configured for storing part of the inflated second-write at a first portion, an ECC code of the first-write at a second portion, and an ECC code of the second-write at either the first portion together with the WOM-encoded data, or alternatively, at a third portion of the spare page area (not shown).

In accordance with the recycling policy, garbage collector 312 may be configured to generate clean or recycled blocks from any of the blocks of planes 310a or 310b.

Upon receiving a request to write data, a write resolver 320 may apply one or more rules to determine if the data should be written as a first or second write. For example, resolver 320 may determine that 'cold' data may be written as a first write, and 'hot' data may be written as a second write.

In an embodiment, data may be classified as hot or cold, as follows: large requests for data, such as if the original request size is 64 KB or more may be classified as cold. Data that is not classified as cold may be classified as hot.

For example, if the data is classified as cold, resolver 320 may designate the data to be written as a first-write. Alternatively, after a predetermined device lifetime threshold, such as 30%, has been met, resulting in a deteriorating reliability of the device to a point where the BER requires a stronger ECC code, or the WOM encoding has failed twice or more, resolver 320 may designate the data to be written as a higher-error-rate enabled first-write. In this case, both the first and second portions of the spare page area may be utilized to store a stronger error correction code corresponding to the higher-error-rate enabled first-write.

A load balancer 324 may select one of active blocks 314a or 314b that may be referenced by the block allocator for the first-write, such as in accordance with a predefined load balancing policy, and the request may be written to the selected block.

Alternatively, if a recycled block is available at both of planes 310a and 310b, and if the data has been classified as hot, resolver 320 may designate the data to be written as a second-write. An encoder 322 may encode the data of the write request, such as via a WOM code, and the encoded data may be written in parallel to active recycled block 316a at plane 310a and to active recycled block 316b at plane 310b, as may be referenced by the block allocator. In this manner, the latency for an inflated second-write may be substantially similar to the latency for a first-write, thereby expending substantially the same latency requirement as for a typical first-write.

In an embodiment, a load balancing policy may select a block in a manner to balance the number of valid pages between the blocks to maintain even wear over the chip. Another load balancing policy may select to write to the plane that currently has the fewest clean pages.

In an embodiment, load balancer 324 may reduce metadata overhead for second writes by selecting pairs of pages that have identical offsets within their respective blocks. An offset counter may be advanced after each second-write to point to the smallest page offset corresponding to invalid data in each of the recycled active blocks 316*a* and 316*b*. In this manner, the next pair of invalid pages available for parallel second-writes may be designated for subsequent access. Since the invalid data stored on these pages is required for computing the WOM code for the subsequent second-write request, this invalid data may be retrieved prior to receiving the request to perform the second write, such as when the previous second-write is performed, and the invalid data may be stored in RAM to reduce latency. A WOM encoder 326 may encode a subsequent data set requested for a second-write using the data prefetched from the designated pair of invalid pages. The encoded data may be written in parallel to both designated pages on blocks 316*a* and 316*b* at the same offset address, to capitalize on the parallel multi-plane command architecture of the chip having maintained a single offset address for each page.

Although invalid pages may be distributed differently in each recycled active block, since most blocks are typically recycled with a very low invalid count, such as 7% of the block size, restricting second writes to pages with identical offsets within their respective blocks is typically an easily met constraint and does not compromise performance.

In an embodiment, a block map may be maintained for associating multiple blocks that have been designated for parallel second-writes. The block map may comprise a table that includes an entry for each block of one plane. If the block has been designated as clean or used, the corresponding entry for that block may be set to null. If the block has been designated as a recycled block, and thus that block was written to in parallel with at least another associated block on another plane as designated by garbage collector 312, the corresponding entry for that block may point to the associated block on the other plane.

For example, the block map may list all the blocks of plane 310*a*, and may list clean active block 314*a* and recycled active block 316*a*. The entry for clean active block 314*a* may point to null, and the entry for recycled active block 316*a* may point to recycled active block 316*b* on block 310*b*.

Upon receiving a request to access a page on a given block, a page map, such as a flash translation layer (FTL) page map mapping logical page addresses to physical addresses, may be queried with the logical page address to retrieve the physical page address of the requested page. Additionally, the block map may be queried with the block address to retrieve any associated blocks. If the block address is associated with another valid block address, it may be determined that the request is for data written via a second-write operation, and thus the retrieved physical page address may address two pages, each page having the same offset address in each associated block. The two pages may be read in parallel, and the inflated data may be decoded accordingly.

For example, upon receiving a request to access a page on block 316*a*, the page map may be queried to return the physical address on block 316*a* of the requested page. Additionally, a query to the block table with the address for block 316*a* may return the address block 316*b*. Since this is not a null address, the requested data was written to using a second-write operation, and thus written on two pages on two separate blocks with the same offset. The first page may be retrieved from block 316*a* at the physical page address obtained from the page map, and the second page may be retrieved from block 316*b* at the same physical page address. As another example, a request to access a page on block 314*a* may be received. Since block 314*a* had been designated as a clean block, its corresponding entry will be null, and only one page will be accessed at the physical page address obtained from the page table.

By maintaining identical offsets for multiple pages in parallel second-write operations, the size of the page map may be reduced substantially than smaller than a naïve page map which would require twice as much memory.

For example, 64K blocks may be addressed using two byte block addresses. The block map may store entries for blocks in plane 310*a* only, and 64 KB would be needed for the block map to reference a device with 64K blocks. Such a device may correspond to a logical capacity of 16 GB to 128 GB, with blocks of size 256 KB to 2 MB, respectively. Since 64 KB is very small compared to the size of page mapping FTLs, and to the available RAM of modern memory devices, the overhead required for mapping of second writes is negligible. The block map can be further reduced, if, instead of storing full block addresses, only the relative block address within plane 310*a* were stored.

In an embodiment, hybrid or block mapping FTLs that typically use page-mapped log blocks for writing data before the data becomes cold and is transferred to data blocks, may be modified as described above to apply second writes to pairs of log blocks. Data blocks may be paired for second writes. Alternatively, second writes may be restricted to data in the log that is classified as hot.

In an embodiment, Garbage collector 312 may implement the memory recycling policy with one or more constraints. Let T represent the physical blocks on a disk and U represent the logical blocks on the device. The overprovisioning ratio may be given as $$\frac{T-U}{U}.$$

Blocks with capacity equivalent to R=T−U are either clean or hold invalid data.

One or more constraints may be imposed on the memory recycling policy to preserve the logical capacity U of the device. One constraint may require that the number of physical blocks in the recycled or reused states not exceed 2R, which is equivalent to a logical capacity of R in order to perform a second write. Thus, the device's physical capacity may comprise T−2R blocks for first writes, and 2R blocks, equivalent to R logical blocks, for second writes, with a total logical disk capacity of T−2R+R, and which is equivalent to the original logical capacity, U.

Another constraint may require at least two clean active blocks in each plane to enable garbage collecting.

Figure 4B:
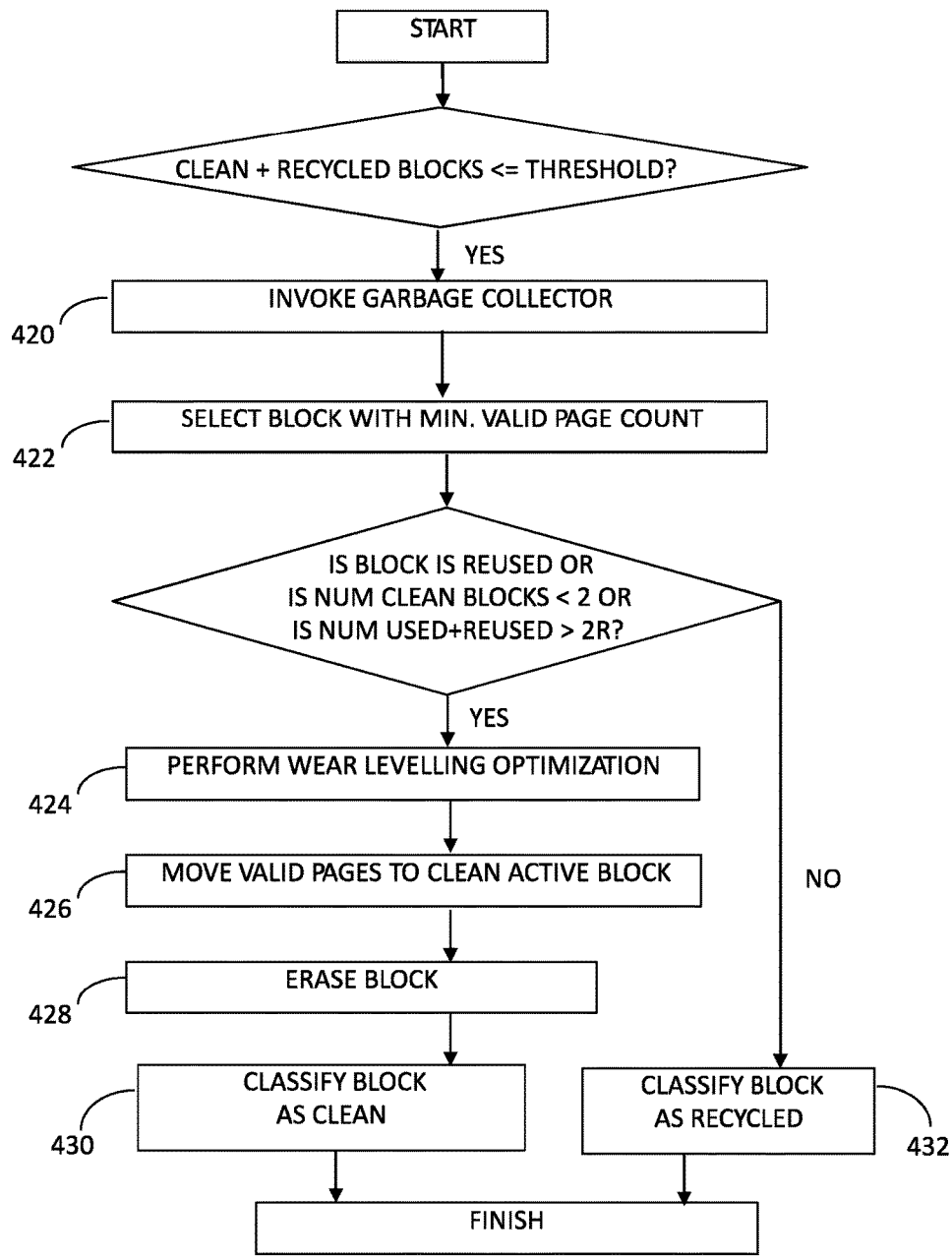
FIG. 4B shows a flowchart of a method for a memory recycling policy, in accordance with an embodiment.

Reference is now made to FIG. 4B which is a flowchart of a method for a memory recycling policy. For a given plane, if the number of available clean and recycled blocks falls beneath a predefined threshold, a garbage collector may be invoked (Step 420). The block with the smallest valid page count may be selected as a victim for erasure or recycling (Step 422). If the block is reused, or if there are fewer than two clean blocks in the plane, or if the total number of reused and recycled blocks is greater than 2R, then the block may be selected for erasure. A wear leveling optimization may be performed (Step 424). One or more valid pages on the block may be read, and the data may be classified as cold. If the data is the result of a first write, the data may be written as a first-write to a clean active block, such as in accordance with a load balancing operation (Step 426). Alternatively, if the valid page is the result of a second-write, the valid page and a second valid page that is associated with the valid page in a second-write are together decoded via a WOM decoder to produce a decoded valid page, and writing the decoded valid page to one of the clean active blocks. In an embodiment the decoded valid page may be written as a first write. The additional page read from the second associated block may be invalidated.

The block may be erased (Step 428) and classified as clean (Step 430). If the block is not reused, and there are more than two clean blocks on the plane, and the total number of reused and recycled blocks is less than or equal to 2R, the block may be classified as recycled and may be made available for second writes (Step 432).

Write amplification caused by copying valid pages to clean active blocks may be reduced by increasing overprovisioning. Thus, logical storage capacity may be sacrifice to improve performance by reducing latency as well as the number of erasures and may prolong the lifetime of the block.

By applying the policy and constraints above, the number of used blocks that may be erased, such as if too many reused blocks have a high valid page count, or if the number of reused and recycled blocks reaches 2R, is reduced.

In an embodiment, each plane may be provided with its own garbage collector, allowing page movement during cleaning within the plane, and avoiding inter-plane overhead.

If a second-write fails, such as if a failed WOM encoding requires writing a 0 to a cell that has already been set to 1, a second WOM encoding may be computed and written to an alternative pair of invalid pages. Since the two WOM encodings are applied to different data combinations, they are independent in terms of success probability. Thus, the probability of success in the first encoding or the retry is $P'=1-(1-P)^2$, or 99.75% for a failure rate of 5%.

The overhead incurred by each retry is that of the additional WOM computation, plus that of reading another pair of physical pages. However, the extra read overhead may be avoided by applying Polar WOM codes, or additional codes that allow independent retries. Due to the probabilistic nature of these codes, the retry may be performed using the same physical invalidated data, while only altering an internal encoding parameter. Successive retries are independent, yielding a similar overall success probability as with the general retry method described above. Thus, a WOM code failure may trigger one or more retries, without incurring an additional read. If the retry fails, the page may be written as a first write.

The present invention may be a system, a method, and/or a computer program product. The computer program product may include a computer readable storage medium (or media) having computer readable program instructions thereon for causing a processor to carry out aspects of the present invention.

The computer readable storage medium can be a non-transitory, tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention may be described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Experimental Results

The results of various experimental simulations of the methods and systems disclosed above to reuse one or more blocks of a memory device are now described. The implementation of second writes with the other disclosed optimization techniques were evaluated in experimental simulations using the SSD extension of the DiskSim simulator and a set of workloads described in J. S. Bucy, J. Schindler, S. W. Schlosser, and G. R. Ganger: *The DiskSim simulation environment version 4.0 reference manual*, May 2008. Second writes were shown to reduce the number of erasures by approximately 33%, resulting in a 15% life-time extension for the SSD. By reducing the number of erasures while preserving the read and write latency of individual operations, I/O response time was reduced by up to 15% for enterprise architectures and up to 35% in consumer class SSD architectures. Furthermore, the techniques described herein are orthogonal to most existing techniques for extending SSD lifetime, and thus may be combined to provide additional lifetime extension.

The simulator was configured with two planes in each flash chip, so that each plane was an independent allocation pool, allowing parallel execution of commands in separate planes within each chip. Second writes were simulated by mapping a logical page to two physical pages that have to be read and written. A random number generator was used to simulate encoding failures, and disable second writes on blocks that reach 30% of their lifetime.

The SSD extension of DiskSim implements a greedy garbage collector with wear leveling and migrations, copying cold data into blocks with remaining lifetime lower than a threshold. This process was modified so that it applies only to victim blocks that were going to be erased. Garbage collection was invoked when the total of clean and recycled blocks in the plane reached a threshold of 1%. DiskSim initialized the SSD as full. Thus, every write request in the trace generated an invalidation and an out-of-place write. Two common overprovisioning values were used: 7% and 28%, representing consumer and enterprise products. The unmodified version of DiskSim enabling only first writes only was referred to as the standard SSD.

The design was evaluated using real world traces from two sources. The first is the MSR Cambridge workload described in D. Narayanan, A. Donnelly, and A. Rowstron. *Write off-loading: Practical power management for enterprise storage*. Trans. Storage, 4(3):10:1-10:23, November 2008, which contains traces from 36 volumes on 13 servers. The second was the Microsoft Exchange workload from one of the servers responsible for Microsoft employee e-mail described in D. Narayanan, E. Thereska, A. Donnelly, S. Elnikety, and A. Rowstron. *Migrating server storage to SSDs: Analysis of tradeoffs*. In 4th ACM European Conference on Computer Systems (EuroSys), 2009. The volumes are configured as RAID-1 or RAID-5 arrays, so some of them are too big to fit on a single SSD. 16 traces were used, whose address space could fit in an SSD size of 256 GB or less, and that included enough write requests to invoke the garbage collector on that disk. These traces vary in a wide range of parameters, summa-rized in Table 3 below. In addition, two synthetic workloads with Zipf distribution were used, with exponential parameter $\alpha=1$ and 2.

TABLE 3

Trace characteristics. The duration of all production traces was one week, except for prxy_1 and exch_0 which were one day.

| Volume | Re-quests | Disk Size (GB) | Requests/Sec | Write ratio | Average write | size (KB) | Total writes (GB) |
|---|---|---|---|---|---|---|---|
| Zipf(1, 2) | 3 | 4 | 200 | 200 | 1 | 4 | 12 |
| Src 1_2 | 2 | 16 | 3.15 | 95.69 | 0.75 | 33 | 45 |
| stg 0 | 2 | | 3.36 | 10.23 | 0.85 | 10 | 16 |
| hm 0 | 4 | 32 | 6.6 | 48.62 | 0.64 | 9 | 23 |
| rsrch 0 | 1.5 | | 2.37 | 6.16 | 0.91 | 9 | 11 |
| src2 0 | 1.5 | | 2.58 | 19.95 | 0.89 | 8 | 10 |
| ts 0 | 2 | | 2.98 | 14.4 | 0.82 | 8 | 12 |
| usr 0 | 2.5 | | 3.7 | 12.54 | 0.6 | 11 | 14 |
| wdev 0 | 1 | | 1.89 | 7.41 | 0.8 | 8 | 7 |
| prxy 0 | 12.5 | 64 | 20.7 | 42.57 | 0.97 | 7 | 83 |
| mds 0 | 1 | | 2 | 5.61 | 0.88 | 8 | 8 |
| proj 0 | 4 | | 6.98 | 132.71 | 0.88 | 41 | 145 |
| web 0 | 2 | | 3.36 | 18.52 | 0.7 | 13 | 17 |
| prn 0 | 5.5 | 128 | 9.24 | 145.1 | 0.89 | 11 | 54 |
| exch 0 | 4 | | 45.28 | 90.56 | 0.92 | 27 | 94 |
| src2 2 | 1 | 256 | 1.91 | 271.41 | 0.7 | 55 | 42 |
| prxy 1 | 24 | | 278.83 | 120.81 | 0.35 | 13 | 106 |

Parameters were used from three different NAND flash manufacturers, corresponding to a wide range of block sizes and latencies, specified in Table 4.

TABLE 4

NAND flash characteristics used in the experiments

| Manufacturer | Type | Pages/ Block | Read ($\mu s$) | Write (ms) | Erase (ms) | Size (Gb) |
|---|---|---|---|---|---|---|
| Toshiba | SLC | 64 | 30 | 0.3 | 3 | 32 |
| Samsung | MLC | 128 | 200 | 1.3 | 1.5 | 16 |
| Hynix | MLC | 256 | 80 | 1.5 | 5 | 32 |

While the flash packages are distributed in different sizes, it was assumed they can be used to construct SSDs with the various sizes required by the workloads. Due to alignment constraints of DiskSim, the page size was set to 4 KB for all disks. To maintain the same degree of parallelism for all equal sized disks, it was assumed that each chip contains 1 GB, divided into two planes. The number of blocks in each plane varies from 512 to 2048, according to the block size.

To evaluate the performance of Reusable SSD, the relative number of erasures and the relative response time of the design were measured and compared to the standard SSD. In a standard SSD, the number of erasures is an equivalent measure to write amplification. In all the figures that follow, the traces are ordered by the amount of data written compared to the physical disk size, i.e., in mds 0 the least data was written, and in zipf (1) and (2) the most.

Figure 5:
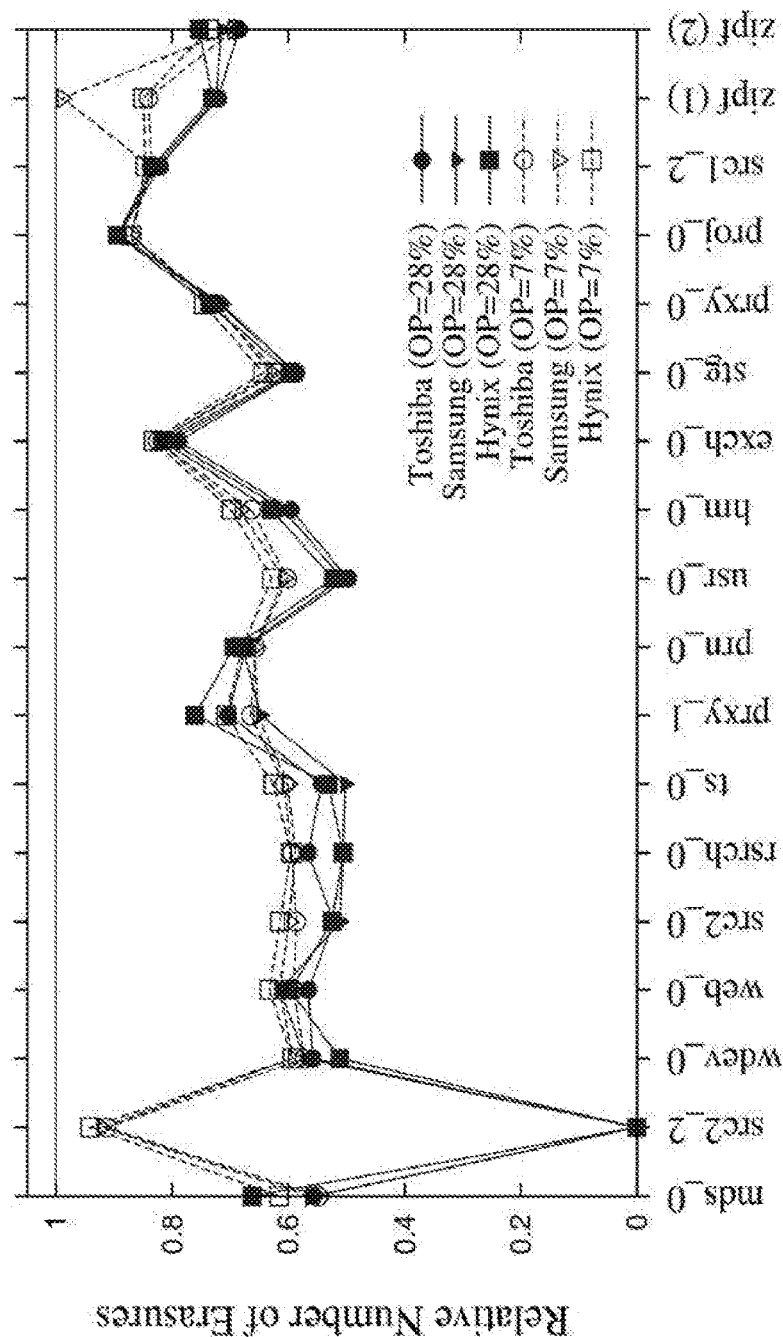
FIG. 5 shows an improvement in the relative number of erasures, in accordance with an embodiment.

Reference is now made to FIG. 5 which shows an improvement in the number of erasures, in accordance with an embodiment. According to the best case analysis, Reusable SSD can write up to 50% more pages on a block before its erasure, corresponding to a reduction of 33% in the number of block erasures. In most traces, the reduction is even slightly better, around 40%. This is due to the finite nature of the simulation since some of the blocks were not erased during the simulation. Since reusable SSD can apply second writes in the first 30% of the disk's lifetime, it performs additional writes equivalent to a lifetime extension of 15%.

In several traces the reduction was less than 33%, because a large portion of the data was written in I/O requests larger than the 64 KB threshold. The corresponding pages were classified as cold and written as first writes, so the full potential of second writes was not realized. In traces src2 2, prxy 1, exch 0, prxy 0, proj 0 and src1 2, the percentage of such cold pages was 95, 44, 83, 32, 86 and 78, respectively (compared to 1%-15% in the rest of the traces).

The different block sizes of the disks we used affect the absolute number of erasures, both for standard and for Reusable SSD. However, the relative number of erasures was almost similar for all block sizes.

The synthetic Zipf workloads have no temporal locality, so more pages remain valid when blocks are erased or recycled, especially with zipf(1) which has less access skew than zipf(2). With low overprovisioning, Reusable SSD is less efficient in reducing erasures for this work-load because there are fewer invalid pages for use in second writes.

The reduction in the number of erasures usually depends on the disk's overprovisioning (OP). Higher over-provisioning means the maximum number of blocks that can be in the reused or recycled states (2R) is higher, thus allowing more pages to be written in second writes. In the extreme case of trace src2 2 with OP=28%, all writes could be accommodated by the overprovisioned and recycled blocks, thus reducing the number of erasures to 0. In the other traces with a high percentage of cold data, the number of erasures did not decrease further with overprovisioning because fewer blocks were required to accommodate the "hot" portion of the data.

Overprovisioning notably affects the performance of first as well as second writes. When overprovisioning is low, garbage collection is less efficient because blocks are chosen for cleaning while they still have many valid pages that must be moved. This degrades performance in two ways. First, more block erasures are required because erasures do not generate full clean blocks. Second, cleaning before erasure takes longer, because the valid pages must be written first. This is the notorious delay caused by write amplification, which is known to increase as overprovisioning decreases.

Figure 6:
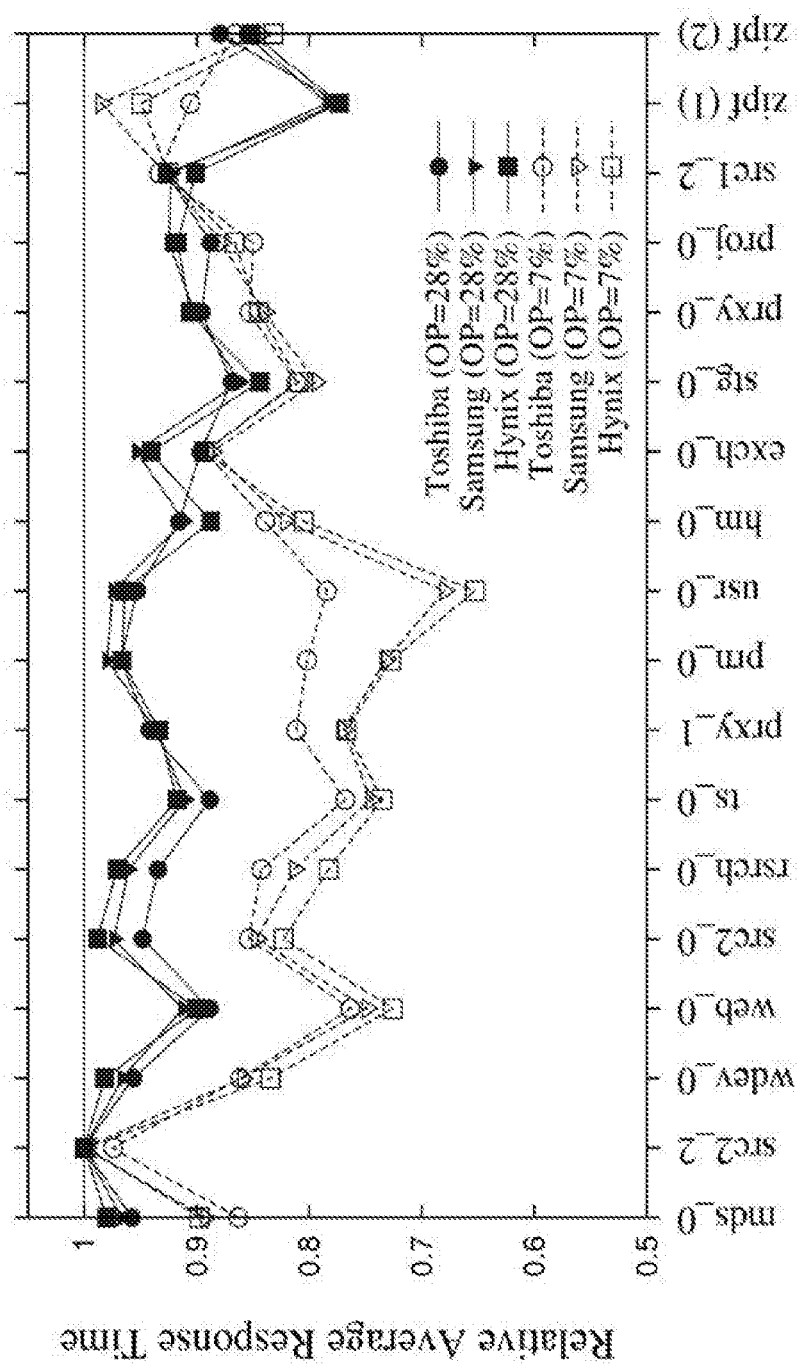
FIG. 6 shows a reduction in average input/output (I/O) response time, in accordance with an embodiment.

Indeed, the reduction in erasures achieved by Reusable SSD further speeds up I/O response time when overprovisioning is low. FIG. 6 shows the reduction in average I/O response time achieved by Reusable SSD compared to the standard SSD, in accordance with an embodiment. I/O response time decreased by as much as 15% and 35%, with OP=28% and P=7%, respectively.

The delay caused by garbage collection strongly de-pends on write and erase latencies, as well as on the block size. When overprovisioning is low (7%) and writes cause a major delay before erasures, the benefit from second writes is greater for disks with longer write latencies—the benefit in the Hynix setup is up to 60% greater than in the Toshiba setup. When overprovisioning is high (28%) and the cost of cleaning is only that of erasures, the benefit from second writes is greater for disks with small blocks whose absolute number of erasures is greater—the benefit in the Toshiba setup is up to 350% greater than the benefit in the Hynix setup.

To establish the importance of parallelizing second writes, a "sequential" version of the design was implemented, where second writes are performed on a pair of contiguous invalid pages on the same block. The two planes in each chip can still be accessed concurrently—they each have an independently written RecycledActive block. The reduction in the number of cleans is almost identical to that of the parallel implementation, but the I/O response time increases substantially. In the majority of traces and setups, second writes increased the I/O response time, by an average of 15% and as much as 31%, which was expected. Data written by a second-write requires twice as many pages to be accessed, both for reading and for writing, and roughly 33% of the data in each trace is written as second writes.

In fact, the I/O response time increased less than expected, and sometimes decreased even with the sequential implementation. The major reason is the reduction in erasures—the time saved masks some of the extra latencies of second writes. Another reason is that although roughly 33% of the data was written in second writes, only 1%-19% of the reads (2%-6% in most traces) accessed pages written in second writes. This corresponds to a well-known characteristic of secondary storage, where hot data is often overwritten without first being read. Nevertheless, an increase of 15%-30% in average response time is an unacceptable performance penalty. The parallel design complements the reduction in erasures with a significant reduction in I/O response time.

Figure 7:
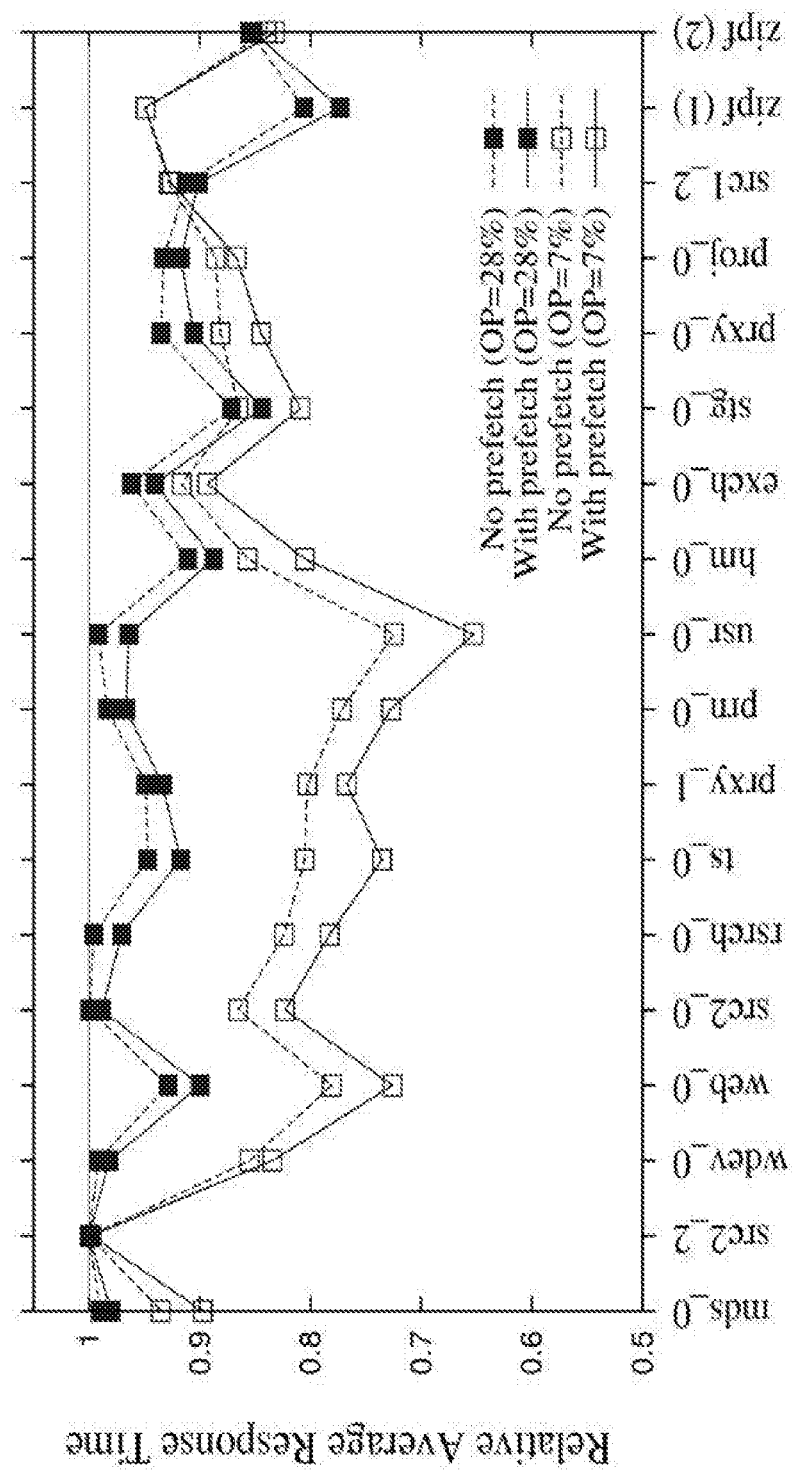
FIG. 7 shows relative I/O response times with respect to prefetching data, in accordance with an embodiment.

To evaluate the contribution of prefetching invalid pages, prefetching was disabled and the experiments repeated. FIG. 7 shows relative input/output (I/O) response times with respect to prefetching data, in accordance with an embodiment. These are the two setups where second writes achieved the least and most reduction in I/O response time, respectively. These are also the setups where the contribution of prefetching was the highest and lowest, respectively.

With OP=7%, and specifically the Hynix setup, the reduction in erasures was so great that the extra reads before second writes had little effect on overall performance. Prefetching reduced I/O response time by an additional 68% at most. With OP=28%, where the reduction in I/O response time was less substantial, prefetching played a more important role, reducing I/O response time by as much as ×21 more than second writes without it.

The results for the rest of the setups were within this range; the average I/O response time for second writes with prefetching was 120% shorter than without it. Prefetching never delayed reads or first writes to the point of degrading performance.

When an I/O request size is equal to or larger than the hot/cold threshold, its data is classified as cold and written in first writes. We examine the importance of separating hot data from cold, and evaluate the sensitivity of the design to the value of the threshold. The threshold was varied from 16 KB to 256 KB. FIGS. 8A-D show the results for the Toshiba setup—the results were similar for all disks. Presented are only the traces for which varying the threshold changed the I/O response time or the number of erasures. The results for 256 KB were the same as for 128 KB.

Reference is made to FIGS. 8A-D which show relative I/O response times and erasures for varying hot/cold classification thresholds, in accordance with an embodiment.

Figure 8B:
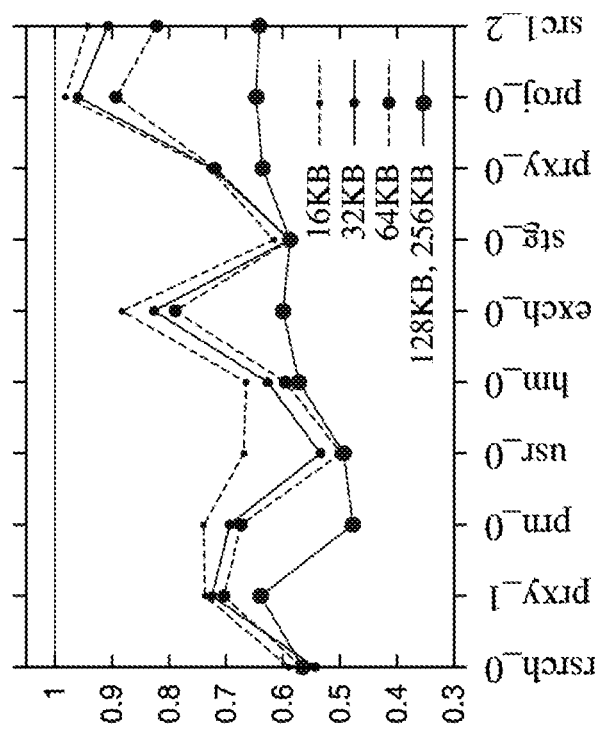
FIGS. 8A-D show relative I/O response times and erasures for varying hot/cold classification thresholds, in accordance with an embodiment.
Figure 8A:
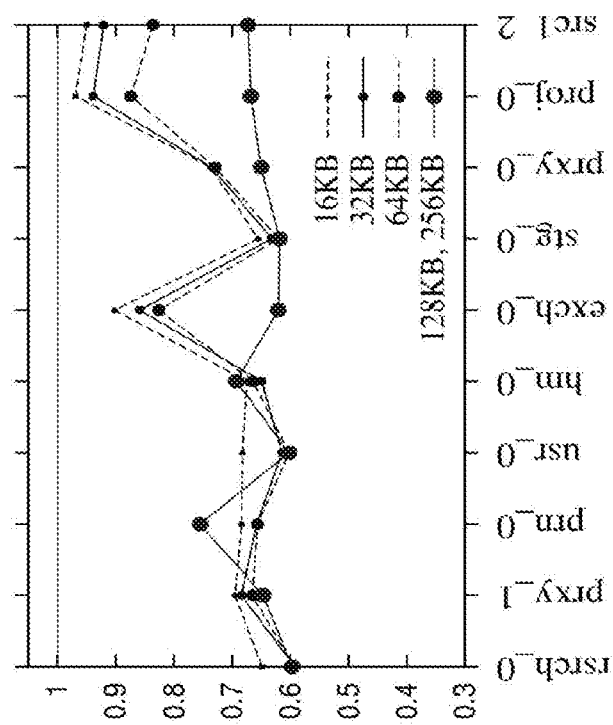

FIG. 8A shows that as the threshold increases, more data is written in second writes, and the reduction in the number of erasures approaches the expected 33%. However, increasing the threshold too much sometimes incurs additional cleans. For example, in prn 0, data written in requests of 64 KB or larger nearly doubled the valid count of victim blocks chosen for cleaning, incurring additional delays as well as additional erase operations. FIG. 8C shows that a reduction [increase] in the number of erasures due to higher thresholds entails a reduction [increase] in the relative I/O response time.

Figure 8D:
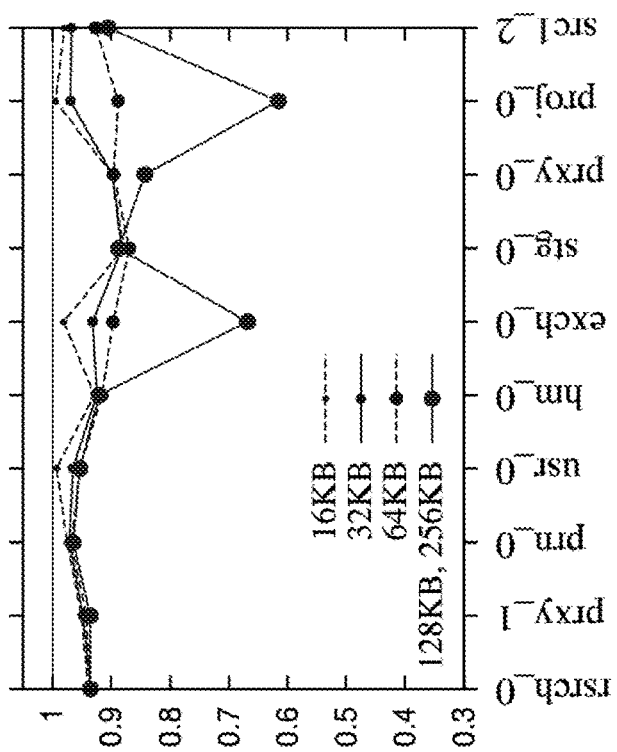
Figure 8C:
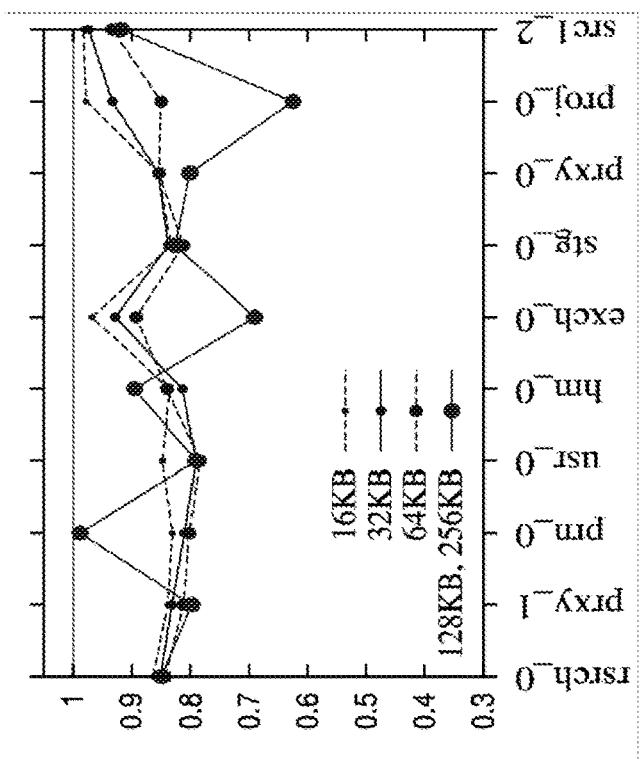

FIGS. 8B and 8D show the results for the same experiments with OP=28%. The additional overprovisioned capacity extends the time between cleans, to the point where even the cold data is already invalid by the time its block is erased. Both the number of erasures and the I/O response time decrease as more data can be written in second writes. Specifically, FIG. 8B shows that the full "50% free" writes can be achieved in enterprise class setups. Still, the hot/cold classification guarantees better performance, possibly at the price of limiting the reduction in erasures.

Figure 9A:
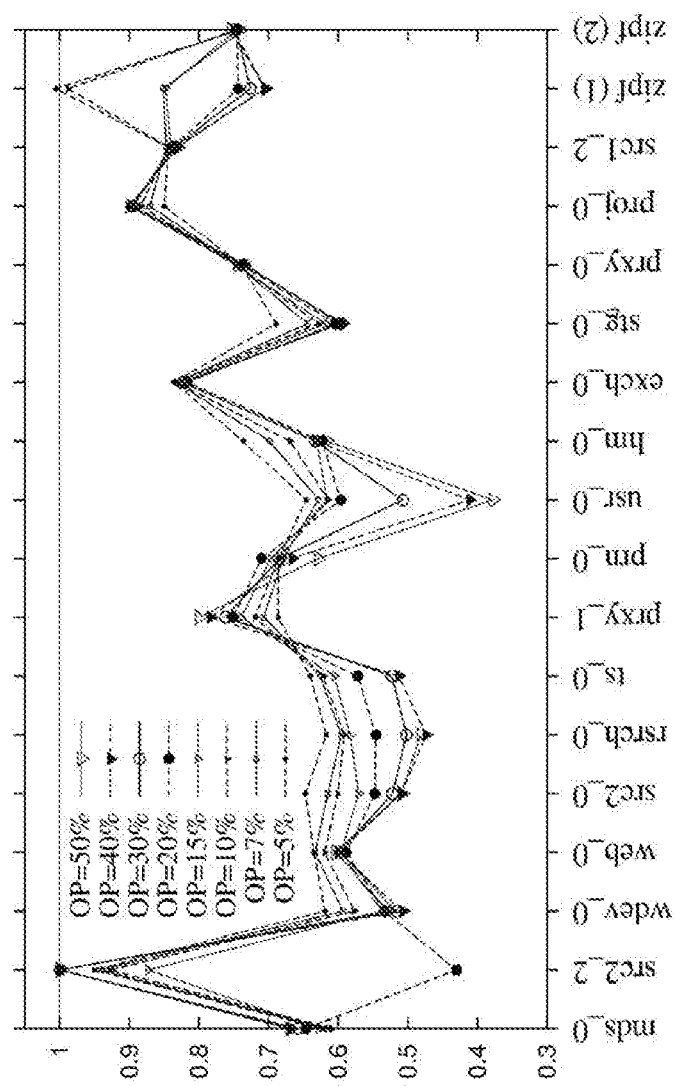
FIG. 9A shows relative number of erasures with varying overprovisioning ratios.
Figure 9B:
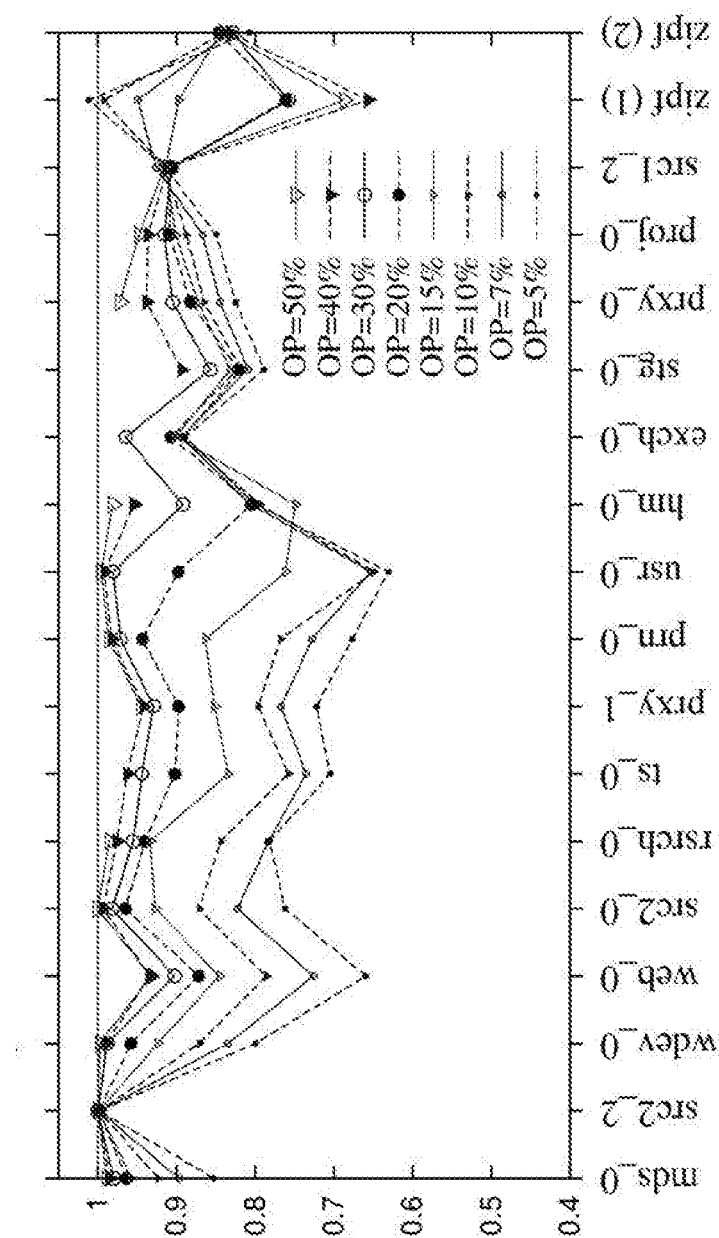
FIG. 9B shows a relative average response times with varying overprovisioning ratios.

For a comprehensive analysis of overprovisioning the experiments were repeated, varying the overprovisioning value from 5% to 50%3. For all the disks and traces, the number of erasures and the I/O response time decreased as overprovisioning increased, both in the standard SSD and in Reusable SSD. FIGS. 9A-B show the relative number of erasures and relative I/O response time of Reusable SSD compared to the standard SSD. Results are shown for the Hynix setup, where varying the overprovisioning value had the largest effect on these two measures.

These results support the observation that the reduction in erasures is larger when overprovisioning is higher, except in traces that have a high portion of cold data that is never written as second writes. Reusable SSD reduces I/O response time more with lower overprovisioning, where erasures cause longer delays. The maximal variation in relative average response time was 24%, 32%, and 35% in the Toshiba, Samsung and Hynix setups, respectively.

Reusable SSD is designed to work with any WOM code construction that satisfies the requirements specified above. To evaluate the sensitivity of the design to WOM code characteristics, the experiments were repeated while varying the encoding success rate from 75% to 100%.

In the first set of experiments retries were disable completely, so they serve as a worst case analysis. On a WOM encoding failure we default to a first-write on the CleanActive block. Every such failure incurs the over-head of an additional ECC computation, because ECC must be computed for the logical data. The ECC for a 4 KB page can usually be computed in less than 10 µs. To account for changes in page size, ECC and WOM code, and as a worst case analysis, we set the overhead to half the read access time in each disk.

Figures 10A, 10B, 10C:
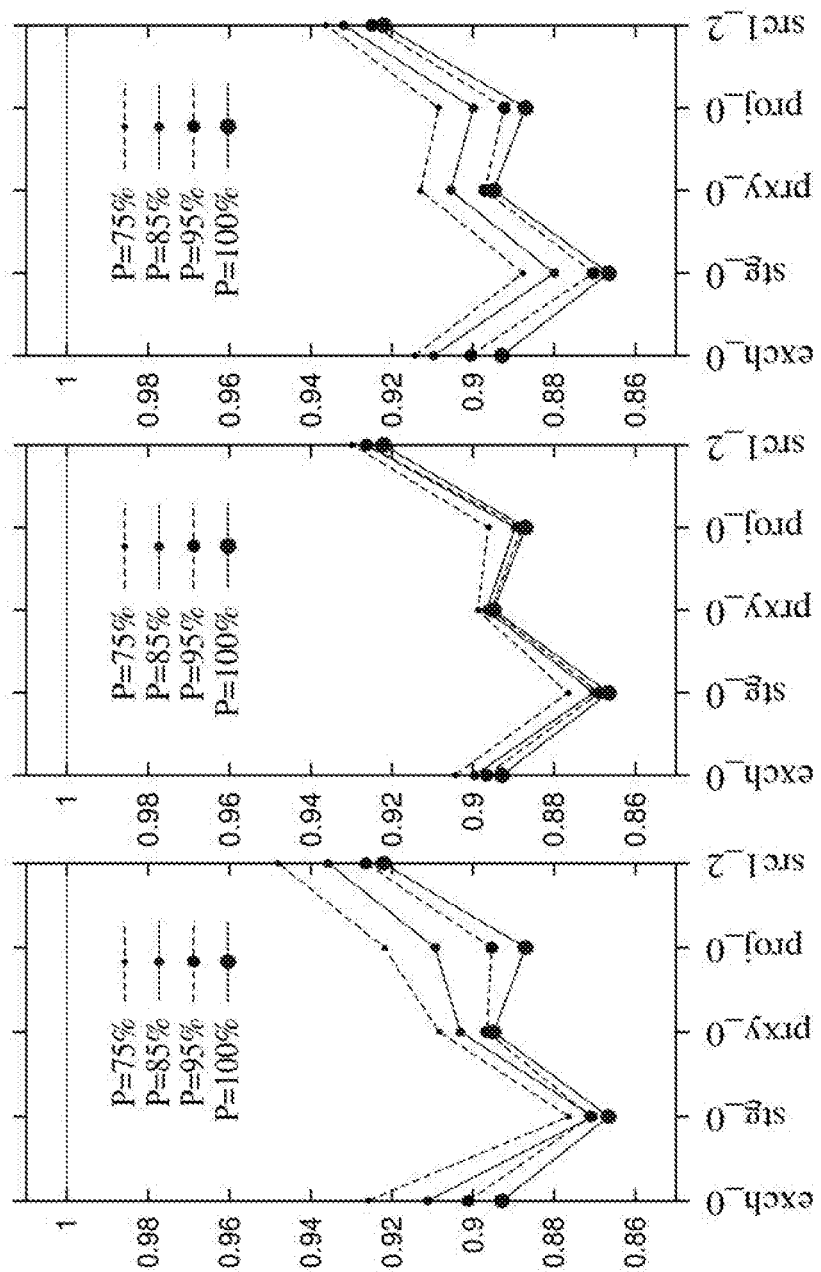
FIGS. 10A-C show the sensitivity of relative average response times with respect to different encoding success rates, in accordance with an embodiment.

FIGS. 10A-C show the sensitivity of relative average response times with respect to different encoding success rates, in accordance with an embodiment.

FIG. 10A shows the relative I/O response time of Reusable SSD without retries, compared to the standard SSD. Surprisingly, varying the success rate resulted in a difference in relative I/O response time of less than 1% for all traces with OP=7%, and for most traces with OP=28%. The reduction in erase operations was not affected at all. Shown here are only the traces for which the difference was larger than 1%. The results with the Toshiba setup were shown because the differences with the other setups were even smaller. The reason for such small differences is that in most traces, the maximum allowed number of reused and recycled blocks does not accommodate all the hot data, and some hot data is written as first writes when no recycled block is available. Thus, WOM encoding failures simply distribute the hot data differently, incurring only the additional ECC computation delay.

FIG. 10B shows the relative I/O response time of Reusable SSD with retries. A retry incurs the same overhead as the first WOM encoding. If that retry fails, extra overhead is incurred by the ECC computation of the first write. Note that with one retry, the overall probability of successful encoding with P=75% is P'=1−(1−0.75)2=93.75%. Indeed, the performance of Reusable SSD with P=75% is almost equal to that of Reusable SSD without retries and P=95%. Similarly, the relative I/O response time with P=95% and one retry is almost equal to that of using a WOM code with no encoding failures (P=100%).

The applicability of the design to WOM codes that do not guarantee independent success probability on the same invalid data was also examined. One more set of experiments was performed where, upon a WOM encoding failure, an additional pair of invalid pages is read, and the encoding is retried on these pages. In this variation, the overheads of retry are the same as in the design, plus an additional read latency. The results, presented in FIG. 10C shows that the additional overhead is negligible when P is high (95%), but nonnegligible for smaller values of P (≤85%). In addition, unlike the first two approaches, this overhead appeared in the rest of the traces as well, and also with OP=7%. Still, even in those cases, the I/O response times were reduced substantially com-pared to the standard SSD, and the difference between P=100% and P=75% was always below 4%.

The energy consumption of an erase operation is typically an order of magnitude larger than that of a write operation, but the energy it consumes per page is the smallest. Of all measured operations, writes are the major contributor to energy consumption in flash chips. In Reusable SSD, roughly 33% of the pages are written in second writes, programming two pages instead of one. Thus, one might expect its energy consumption to increase in proportion to the increase in physical writes.

However, the energy consumed by writes depends on the number of programmed cells. But not only do second writes not require programming twice as many cells, their overall number of programmed bits is expected to equal that of first writes. The energy consumption is expected to decrease, thanks to the reduction in erasures that comes with second writes Reusable SSD separates hot and cold data, and applies wear leveling and migration to blocks that are about to be erased. However, the specific classification or wear leveling technique is orthogonal to this design, and can be replaced with any of the state-of-the-art methods to combine their advantages with those of second writes. Similarly, when some of the write traffic is eliminated from the SSD, Reusable SSD can apply roughly 33% of the remaining writes to reused blocks, eliminating additional erasures.

Disclosed herein is a practical design for applying second writes to extend SSD lifetime while significantly improving performance. The design is general and is applicable to current flash architectures, requiring only minor adjustments within the FTL, without additional hardware or interface modifications.

Nevertheless, more can be gained from Reusable SSD as technology advances in several expected directions. Flash architectures that allow for higher degrees of parallelism can accommodate third and maybe fourth writes, combining 4 and 8 physical pages per logical page, respectively. As the hardware implementation of Polar WOM codes matures, and encoding overheads decrease, faster retries are enabled with higher success probability. Similarly, stronger ECCs can compensate for increasing BERs, increasing the percentage of a block's lifetime in which it can be recycled before erasure.

Since conventional methods for extending SSD lifetime are orthogonal to the design of Reusable SSD, they can be combined with second writes. The performance improvement achieved by Reusable SSD can mask some of the overheads of those schemes that incur additional latencies.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A multiple-write enabled flash memory system, comprising:
   a flash memory comprising at least two planes, wherein each plane comprises multiple blocks, and wherein each block comprises multiple pages;
   a block allocator configured to:
      (a) reference one or more clean active blocks on each plane for a first write, wherein the first-write comprises writing one logical page of unmodified data to one physical page, and
      (b) reference one or more recycled active block on each plane for a second write, wherein each page of each recycled active block stores data from a previous first-write; and
   an encoder configured to encode a page of data via a write-once-memory (WOM) code to produce WOM-encoded data,
   wherein a combination of a target page of each recycled active block is configured to store the WOM-encoded data via a second write.

2. The system of claim 1, wherein a first portion of a spare page area provided with each target page is configured to store the WOM-encoded data via the second write.

3. The system of claim 1, wherein referencing the clean active block on each plane comprises selecting a block on each plane that has never been written to, or has been erased and has not been written to since the erasure.

4. The system of claim 1, wherein the target page is retrieved prior to receiving a request to perform the second write.

5. The system of claim 1, further comprising a garbage collector that is configured to designate a block for cleaning, erasing, or recycling, in accordance with a recycling policy.

6. The system of claim 1, wherein the garbage collector is invoked if the number of available clean and recycled blocks falls beneath a predefined threshold.

7. The system of claim 1, further comprising a write resolver that is configured to determine whether to write data as a first-write or as a second write.

8. The system of claim 7, wherein the resolver is configured to direct a request to write cold data as a first write, and to direct a request to write hot data as a second write.

* * * * *